United States Patent
Sakamoto et al.

(10) Patent No.: US 7,875,883 B2
(45) Date of Patent: Jan. 25, 2011

(54) ELECTRIC DEVICE USING SOLID ELECTROLYTE

(75) Inventors: Toshitsugu Sakamoto, Tokyo (JP);
Masakazu Aono, Tokyo (JP); Tsuyoshi Hasegawa, Tokyo (JP); Tomonobu Nakayama, Soka (JP); Kazuya Terabe, Toda (JP); Hisao Kawaura, Tokyo (JP); Tadahiko Sugibayashi, Tokyo (JP)

(73) Assignees: Japan Science and Technology Agency, Saitama (JP); Riken, Saitama (JP); NEC Corporation, Tokyo (JP)

( * ) Notice: Subject to any disclaimer, the term of this patent is extended or adjusted under 35 U.S.C. 154(b) by 1045 days.

(21) Appl. No.: 10/490,598

(22) PCT Filed: Sep. 24, 2002

(86) PCT No.: PCT/JP02/09759

§ 371 (c)(1),
(2), (4) Date: Aug. 20, 2004

(87) PCT Pub. No.: WO03/028124

PCT Pub. Date: Apr. 3, 2003

(65) Prior Publication Data

US 2006/0157802 A1    Jul. 20, 2006

(30) Foreign Application Priority Data

Sep. 25, 2001    (JP)    ............................. 2001-292392

(51) Int. Cl.
*H01L 29/06* (2006.01)

(52) U.S. Cl. ........... 257/41; 257/E45.002; 257/E45.003

(58) Field of Classification Search ............ 257/41, 257/315, 910, E45.002, E45.003
See application file for complete search history.

(56) References Cited

U.S. PATENT DOCUMENTS

| 4,698,657 | A * | 10/1987 | Watanabe et al. | ............ 257/253 |
| 5,761,115 | A * | 6/1998 | Kozicki et al. | ............... 365/182 |
| 6,314,014 | B1 * | 11/2001 | Lowrey et al. | ............... 365/100 |
| 6,418,049 | B1 * | 7/2002 | Kozicki et al. | ............... 365/174 |

FOREIGN PATENT DOCUMENTS

| JP | 628841 A | 2/1994 |
| JP | 2002-76325 A | 3/2002 |

(Continued)

OTHER PUBLICATIONS

Kazuya Terabe, et al., "Quantum point contact switch realized by solid electrochemical reaction", Riken Review, Jul. 2001, No. 37, pp. 7 to 8.

*Primary Examiner*—Thao X Le
*Assistant Examiner*—Robert Huber
(74) *Attorney, Agent, or Firm*—Sughrue Mion, PLLC

(57) ABSTRACT

The present invention relates to a transistor for selecting a storage cell and a switch using a solid electrolyte. In a storage cell, a metal is stacked on a drain diffusion layer of a field-effect transistor formed on a semiconductor substrate surface. The solid electrolyte using the metal as a carrier is stacked on the metal. The solid electrolyte contacts with the metal via a gap, and the metal is connected to a common grounding conductor. A source of the field-effect transistor is connected to a column address line, and a gate of the field-effect transistor is connected to a row address line.

11 Claims, 14 Drawing Sheets

FOREIGN PATENT DOCUMENTS

| | | | |
|---|---|---|---|
| JP | 2002-141494 A | 5/2002 | |
| JP | 20021414494 A | 5/2002 | |
| WO | WO9908325 | * | 2/1999 |
| WO | WO 02/21598 A1 | 3/2002 | |
| WO | WO 02/37572 A1 | 5/2002 | |

* cited by examiner (A)

(B)

(A)

(B)

(A)

(B)

ELECTRIC DEVICE USING SOLID ELECTROLYTE

TECHNICAL FIELD

The present invention mainly relates to an electric device using a solid electrolyte. Particularly, the present invention relates to a nonvolatile storage device which uses a solid electrolyte and which enables to achieve high integration and high speed, and a method of manufacturing the device.

BACKGROUND ART

In a recent highly information-oriented society, a storage device temporarily or semipermanently holding a large amount of information has been indispensable. Above all, a dynamic memory (DRAM), a flash memory, a read-only memory (ROM) and the like for use in a computer are well known.

A first related art is a flash memory. A storage cell of the flash memory comprises one floating gate type transistor. A floating gate electrode disposed between a channel region between source and drain and a control gate electrode is used as a storage node of information.

A charged state of the floating gate electrode is set in accordance with "0" and "1" of the information. Since the periphery of the floating gate electrode is surrounded with an insulating film, the charge stored in the electrode is not lost even after power cut-off, and therefore, nonvolatility is realized. A read operation is performed by using a property of a threshold voltage which changes in accordance with a charge amount stored in the floating gate electrode. A write/delete operation of the information is performed by injection of electrons into a floating gate or release of the electrons from the floating gate electrode by a tunnel current via an oxide film.

A second related art is a quantum point contact switch using an electrochemical reaction in the solid electrolyte (refer to Riken Review No. 37, p. 7, 2001). The solid electrolyte is a material in which ions are freely movable in a solid as in a solution, and many materials that exhibit conduction of cations or anions have heretofore been found. When an electric field is added, metal ions constituting carriers move in the solid thereby to flow currents.

In the above-described document, a switch using silver sulfide which is a silver ion conductive solid electrolyte is described. The surface of a silver wire is sulfurated to form silver sulfide, and a platinum wire is brought close to a micro gap. When a positive voltage is added to silver sulfide, and a negative voltage is added to platinum, silver ions in silver sulfide are deposited as silver atoms on the surface, and a bridge of silver is formed in the gap from platinum to form a point contact. The current hardly flows between silver sulfide and platinum in case where the bridge is not formed. When the bridge is formed, the current flows.

The formation and disappearance of the bridge occur at a high rate which is a microsecond or less. The current flowing in the bridge is quantized. The quantization of the current indicates that the bridge is formed of several atomic chains, and has a size of a nanometer order. With the use as the switch, a high-rate operation, low power consumption, and further high integration are possible. In the related art, it is described that application to the switch or memory results in formation of a new device.

The flash memory of the first related art is a device characterized by a low bit cost, and it is necessary to realize an advantage bit cost with respect to another memory. In order to realize this, scaling of a storage cell is supposed to advance from now on. However, prospects are not bright in the actual situation. One of causes for that lies in a tunnel oxide film leak current generated with an increase of the number of rewrites.

The leak current is a fatal phenomenon in which the charges stored in the floating gate electrode are eliminated. Since the leak current rapidly increases with the decrease of thickness of the oxide film, it is supposedly difficult to reduce the thickness of the tunnel oxide film. There arises a necessity for consideration of the scaling which does not depend on the film thickness reduction.

In the second related art, upon forming the gap, use is made of a method of using a scanning type tunnel microscope and a method of manually bringing two metal wires close to each other. The method of using the scanning type tunnel microscope has an advantage that one gap can be formed with excellent controllability, but is not suitable for forming a large number of gaps. The method in which the silver sulfide wires or the platinum wires are manually brought close to each other is deteriorated in controllability, and is similarly inappropriate for forming a large number of gaps. Furthermore, in silver sulfide on a silver wire as in the second related art, a size of one storage cell is of a millimeter order, and is not suitable for integration. Therefore, the integration of a storage device is impossible.

It is therefore an object of the present invention to provide a storage device using a solid electrolyte, particularly to a storage device having a circuit constitution advantageous for integration and a method of manufacturing the device.

DISCLOSURE OF THE INVENTION

The present invention is characterized by comprising a transistor for selecting a storage cell and a solid electrolyte switch (see FIG. 3(A)). In detail, the storage cell by a typical aspect of the present invention is characterized in that a first metal thin film is stacked on a drain region of a field-effect transistor formed on a semiconductor substrate surface, a solid electrolyte in which a metal ion of the first metal thin film is used as a carrier is stacked on the first metal thin film, the solid electrolyte intersects with a second metal thin film via a air gap, the second metal thin film is connected to a common grounding conductor, a source of the field-effect transistor is connected to a column address line, and a gate of the field-effect transistor is connected to a row address line (see FIG. 3(B)).

According to another aspect of the present invention, the storage cell is characterized by comprising one diode and one solid electrolyte switch (see FIG. 4(A)). In detail, the aspect is characterized in that a first metal thin film is disposed on one electrode of a diode formed on a semiconductor substrate surface, a solid electrolyte in which a metal ion of the first metal thin film is used as a carrier is disposed on the first metal thin film, a second metal thin film is disposed on the solid electrolyte via an air gap, the second metal thin film is connected to a row address line, and the other electrode of the diode is connected to the column address line (see FIG. 4(B)).

According to still another aspect of the present invention, one storage cell serving as an element of a storage device is characterized by comprising one solid electrolyte switch (see FIG. 5(A)). In detail, the aspect is characterized in that a part of a first metal thin film connected to a row address line formed on a semiconductor substrate surface is a solid electrolyte using a metal ion of the first metal thin film as a carrier, and the solid electrolyte intersects with a second metal thin film connected to a column address line via an air gap (see FIG. 5(B)).

Furthermore, a sacrificial layer needs to be used to form the air gap with excellent controllability in order to highly integrate a solid electrolyte switch. The sacrificial layer upon forming the air gap is characterized by the use of materials insoluble to a developing solution of a photoresist and a solvent of the photoresist, such as a calixarene-based resist which is an electron beam resist, thermosetting resins such as polystyrene and polyimide, a silicon oxide film, and a silicon nitride film.

A solid electrolyte switch which is a constituting element of the representative aspect of the present invention is disposed on an insulating film 52 on a semiconductor substrate 01 (FIG. 6(B)). A first metal thin film 53 is disposed on the insulating film 52, a solid electrolyte 55 using the metal ion of the metal thin film as the carrier is disposed on the metal thin film 53, and further a second metal thin film 54 is disposed via an air gap 56. For a property of the switch using the solid electrolyte, a current flowing in the second metal thin film 54 indicates a hysteresis at room temperature, when the first metal thin film 53 is grounded and a voltage added to the second metal thin film 54 is repeatedly increased/decreased in a predetermined range (FIG. 6(A)).

As shown in FIG. 6(A), when the voltage applied to the second metal thin film 54 rises/lowers between a first voltage (−0.2 V) and a second voltage (0.5 V), the hysteresis appears in the current flowing in the second metal thin film 54 at room temperature. When the voltage is decreased in a negative direction from 0 V, the current flows in the vicinity of −0.2 V. A resistance value is about 20 ohms. When the voltage is swept in a positive direction, the current rapidly decreases at +0.06 V. It is seen that a bistable state in which there is a difference of two or more digits in resistance can be realized between −0.2 and 0.06 V. It is seen that when the voltage is small, the bistable state is held in (−0.2 to 0.06 V), and a latch function is realized. It has not heretofore been known that a switch operation and a latch operation are performed in the solid electrolyte 55 on the first metal thin film 53, and this has experimentally been found by the present inventors. In an experiment of FIG. 6A, the first metal thin film 53 is a silver thin film, the solid electrolyte 55 is a silver sulfide thin film, and the second metal 54 is platinum.

The above-described hysteresis property can be explained as follows with reference to FIG. 6(B).

When the first metal thin film 53 is grounded, and the negative voltage is added to the second metal thin film 54, electrons are supplied to the solid electrolyte 55 from the second metal thin film 54 by a tunnel current, and the metal ions are reduced on a solid electrolyte surface to deposit a metal 57. When the deposition is repeated, the air gap 56 is narrowed, and finally a bridge is formed between the solid electrolyte and the second metal thin film 54. At this time, the solid electrolyte 55 is electrically connected to the second metal thin film 54 so that the current flows. On the other hand, when the positive voltage is added to the second metal thin film 54, the bridge of the deposited metal 57 is oxidized, and diffused into the solid electrolyte 55. When the oxidation is repeated, finally the air gap 56 is formed, and the solid electrolyte 55 is electrically disconnected from the second metal thin film 54.

From the above, it has been seen that the current can be turned on/off in one solid electrolyte switch. It is further seen that an on/off state is held at a certain voltage or less, and the switch has the latch function. When the latch function is used, memory operations such as write, hold, and read of information are possible. The solid electrolyte switch may have a size equal to an atomic size, and further miniaturization is possible as compared with a typical electric device.

The material insoluble to the organic solvent or the developing solution of the photoresist is used in forming the air gap between the metal thin film and the solid electrolyte. For example, when the calixarene is exposed by the electron beam, molecules bond to each other to thereby form polymer having a large size. The polymer formed thus is a stable material which is insoluble to the solvent or the developing solution of the photoresist. On the other hand, since the material is organic, it is carbonized by oxygen plasma treatments such as oxygen ashing, and can be removed. As described above, it is possible to control the air gap in the switch using the solid electrolyte with excellent controllability so that a large number of devices can be integrated.

FIG. 14(A) shows a current/voltage property of the solid electrolyte switch in which copper sulfide is used in the solid electrolyte 55, titanium is used in the second metal thin film 54, and copper is used in the first metal thin film.

The voltages at which transition between the on-state and the off-state of the solid electrolyte switch occurs are −1 V or more, 1 V or less, respectively. It is found out that when the voltage is applied to the same solid electrolyte switch in a range of −3 to 5 V as shown in FIG. 14(B), the voltage causing the transition of the on/off-state increases.

The on-state transits to the off-state at 3 V, and conversely the off-state transits to the on-state at −3 V. The transition voltage changes by movement of copper ions in the solid electrolyte, and this relates to spread of the above-described ion depletion layer. It has not heretofore been known that the transition voltage can be controlled by the size of the applied voltage, and this has experimentally been found by the present inventors.

BEST MODE FOR CARRYING OUT THE INVENTION

Figure 1:
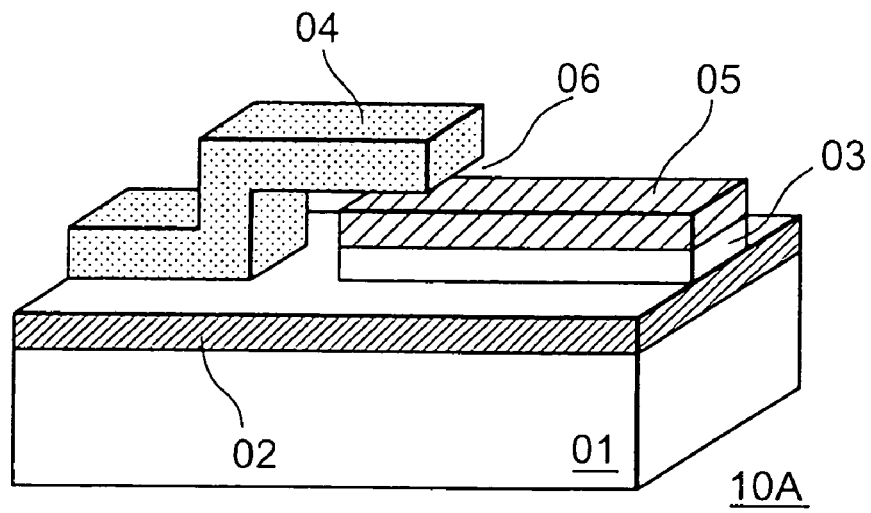
FIG. 1(A) is a diagram showing a solid electrolyte switch according to a first embodiment of the present invention.
FIG. 1(B) is a diagram showing the solid electrolyte switch according to a second embodiment of the present invention.
Figure 1:
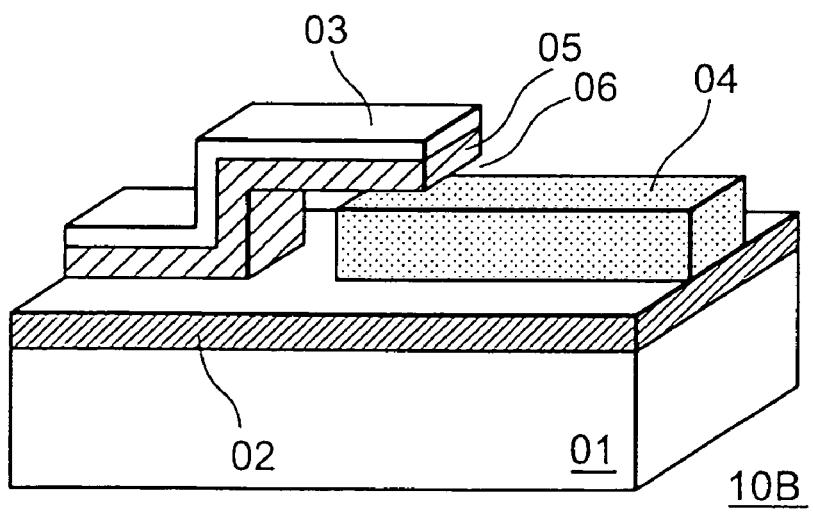

Embodiments of the present invention will be described in detail with reference to the drawings.

First Embodiment

FIG. 1(A) shows a structural diagram of a solid electrolyte switch 10A in accordance with the present embodiment.

The solid electrolyte switch 10A comprises a semiconductor substrate 01 such as silicon. An insulating film 02 having a thickness of about 20 angstroms to 200 angstroms is disposed on the semiconductor substrate 01. The insulating film 02 may be an insulating film formed of a silicon oxide film, silicon nitride film, silicon oxynitride film, and the like. A first metal thin film 03 is disposed on the insulating film 02, and a solid electrolyte 05 using a metal ion which is a material of the first metal thin film 03 as a carrier is disposed on the first metal thin film 03. The metal thin film 03 may be metals such as silver, and may have a film thickness of 200 angstroms to 2000 angstroms. The solid electrolyte 05 may be, for example, silver sulfide, and may have a film thickness of 20 angstroms to 2000 angstroms. A second metal thin film 04 is disposed on the solid electrolyte 05 via an air gap 06.

As one example, a method of manufacturing the solid electrolyte switch will be described with reference to FIGS. 7(A) to 7(D) in a case where the silicon oxide film is used in the insulating film 02, a silver thin film is used in the first metal thin film 03, silver sulfide is used in the solid electrolyte 05, and platinum is used in the second metal thin film 04.

Figure 7:
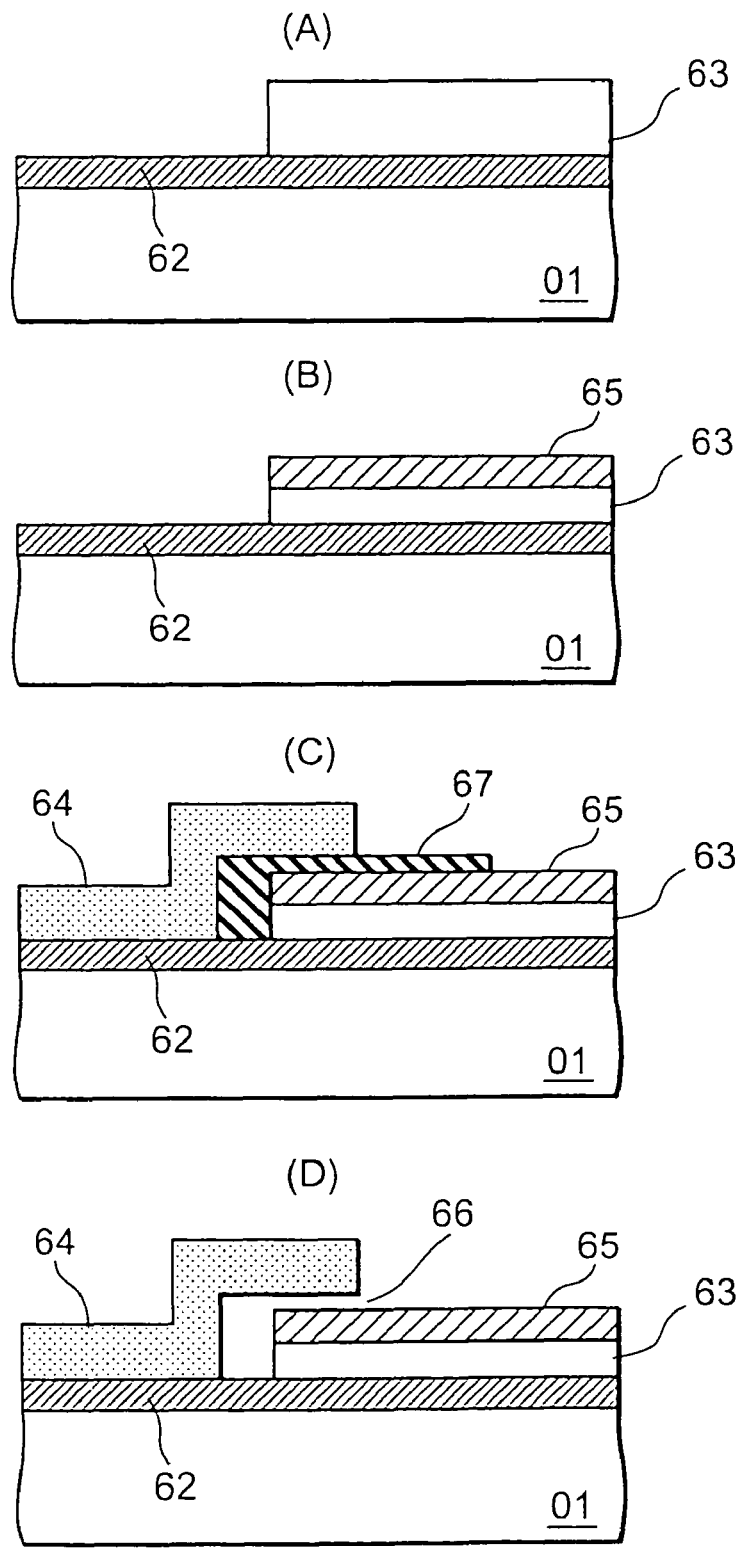
FIGS. 7(A), (B), (C), and (D) are explanatory views of a method of preparing the solid electrolyte switch shown in FIG. 1(A) in order of steps.

A silicon oxide film 62 having a film thickness of 300 nm is formed on the silicon substrate 01 by a thermal oxidation method, and further the silver thin film having a film thickness of 2500 angstroms is formed by a vacuum evaporation method or a sputtering method (FIG. 7(A)).

Thereafter, the film is processed in a thin wire by a wet etching method or a reactive ion etching method. The thin wire may also be processed by a lift-off method. A silver thin film 63 is formed, and subsequently sulfurated (FIG. 7(B)). There are two methods of sulfurating the silver thin film 63. In a first method of sulfuration, a silicon substrate having the silver thin film 63 thereon is brought into a crucible together with a sulfur powder, and heated at 130 degrees in a bake furnace in a nitrogen atmosphere. When conductivity of the silver thin film is measured during the sulfuration, the degree of the sulfuration can be determined so that the silver thin film 63 can be sulfurated with excellent control. The sulfuration is performed until the conductivity becomes about ½.

In the second method of the sulfuration, the substrate is heated at 120 degrees to 300 degrees in hydrogen sulfide diluted with nitrogen. Also in this case, when the resistance of the silver thin film 63 is measured, the sulfuration can be performed with excellent control. By the above sulfuration step, the surface of the silver thin film changes to black silver sulfide. Silver sulfide is a stable material existing in nature, and is not deteriorated in the following steps, or not deteriorated with an elapse of time.

Next, after the film is spin-coated with a calixarene resist, a calixarene resist 67 having a rectangular pattern is formed so as to coat a part of silver sulfide 65 by an electron beam drawing device (FIG. 7(C)). After exposure, developing and rinsing are performed, and thereafter calixarene changes to a chemically stable polymer. Therefore, the resist is not dissolved in the solvent or developing solution of the photoresist. The film thickness of calixarene can be adjusted by changing a revolution number during the spin-coating and concentration of calixarene. When 5 weight % of calixarene (solvent is monochlorobenzene) is used, and a revolution number is 4000 rpm, the film thickness is 170 nm. It is possible to exactly adjust the film thickness on the order of 10 nm.

Subsequently, a platinum thin film 64 is formed. After forming the platinum thin film by the vacuum evaporation method or the sputtering method, the film is processed in the thin wire by the wet etching method or the reactive ion etching method. The thin wire may also be processed by the lift-off method. A calixarene resist 67 formed on silver sulfide exists in a portion which overlaps with the silver sulfide 65, and the silver sulfide 65 does not contact with the platinum thin film 64.

Finally, the calixarene resist 67 is removed by the oxygen ashing or organic solvent (FIG. 7(D)). In the ashing, the organic material is carbonized and consequently removed, and therefore the resist 67 can selectively be removed without damaging silver sulfide or platinum. When the calixarene resist 67 is removed, an air gap 66 is formed between silver sulfide and platinum. The intervals of the air gaps can be adjusted by changing the film thickness of the calixarene resist 67.

An operation method of the solid electrolyte switch 10 will be explained with reference to FIG. 7(D).

When the silver thin film 63 is grounded, and a negative voltage (−0.2 V or more) is applied to the platinum thin film 64, the switch turns on. On the other hand, when a positive voltage (0.06 V or more) is added to the platinum thin film 64, the switch turns off. When the voltage is not applied, or the applied voltage is small (−0.20 to 0.06 V), an on-state or off-state is maintained.

In the above-mentioned embodiment, the calixarene resist 67 is removed to form the air gap 66, but the switching operation was confirmed even in a such state that the calixarene resist 67 was left. It is supposedly because calixarene made of a soft material was pushed away to proceed with silver deposition so that the bridge was formed upon forming the bridge of silver. Therefore, in case where the soft material is used as a sacrificial layer, the sacrificial layer is not always removed.

Second Embodiment

FIG. 1(B) shows a structural diagram of a solid electrolyte switch 10B of another aspect of the present embodiment.

The solid electrolyte switch 10B comprises the semiconductor substrate 01 such as silicon. The insulating film 02 having a thickness of about 20 angstroms to 200 angstroms is disposed on the semiconductor substrate 01. The insulating film 02 may be the insulating film formed of the silicon oxide film, silicon nitride film, silicon oxynitride film and the like. The second metal thin film 04 is disposed on the insulating film 02, and the solid electrolyte 05 is disposed on the second metal thin film 04 via the air gap 06.

The second metal thin film 04 is, for example, the metal such as platinum, and the film thickness may be 200 angstroms to 2000 angstroms. The solid electrolyte 05 is, for example, silver sulfide, and the film thickness may be 20 angstrom to 2000 angstrom. The first metal thin film 03 whose material is the metal ion as the carrier of the solid electrolyte 05 is disposed on the solid electrolyte 05. When silver sulfide is used as the solid electrolyte 05, the first metal thin film 03 may be a silver thin film.

As one example, a method of manufacturing the solid electrolyte switch will be described with reference to FIGS. 8(A) to 8(D) in a case where the silicon oxide film is used in the insulating film 02, the silver thin film is used in the first metal thin film 03, silver sulfide is used in the solid electrolyte 05, and platinum is used in the second metal thin film 04.

Figure 8:
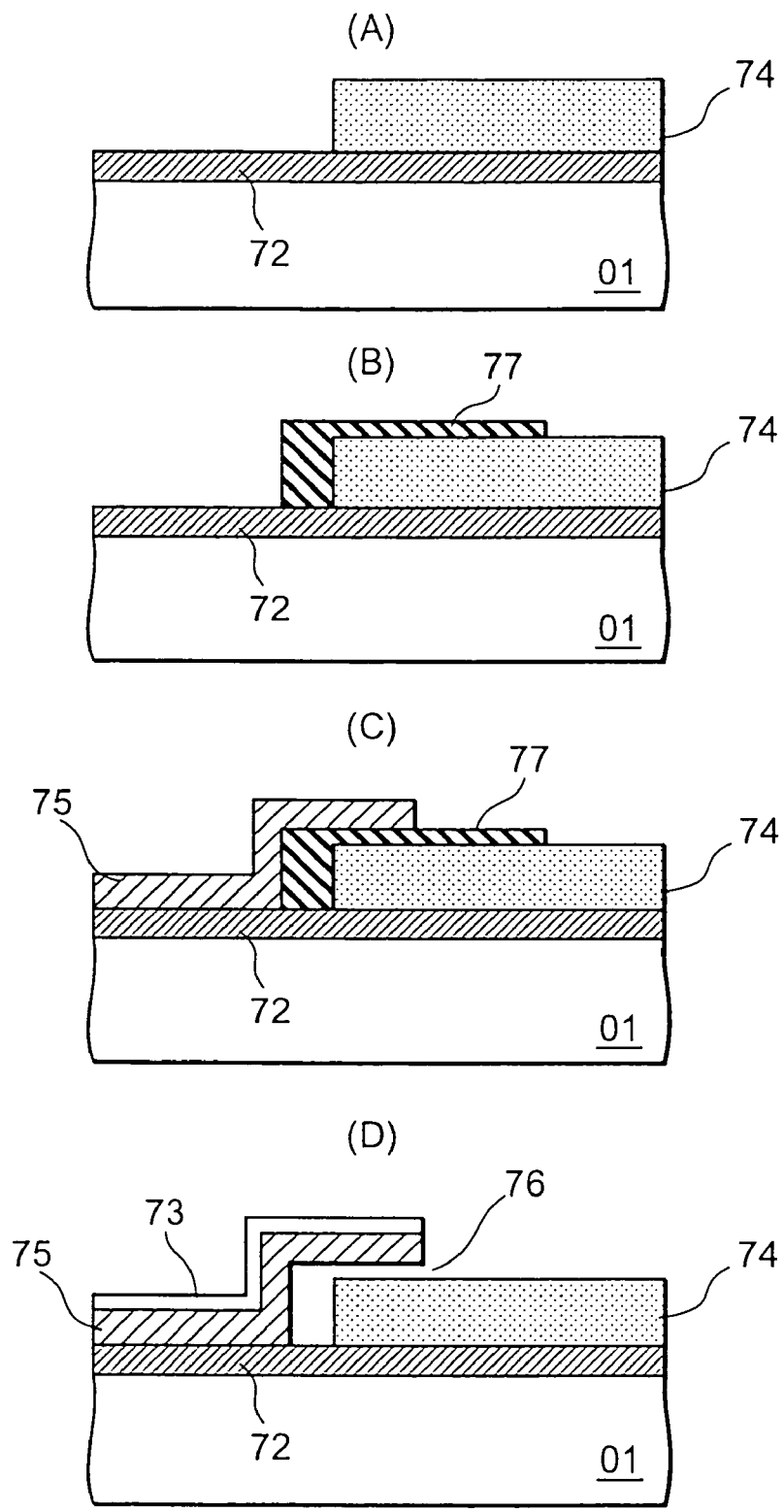
FIGS. 8(A), (B), (C), and (D) are explanatory views of the method of preparing the solid electrolyte switch shown in FIG. 1(B) in order of steps.

A silicon oxide film 72 having a film thickness of 300 nm is formed on the silicon substrate 01 by the thermal oxidation method, and further the platinum thin film having a film thickness of 2500 angstroms is formed by the vacuum evaporation method or the sputtering method (FIG. 8(A)). Thereafter, the film is processed in the thin wire by the wet etching method or the reactive ion etching method. The thin wire may also be processed by the lift-off method.

Next, after the film is spin-coated with the calixarene resist, a calixarene resist 77 having the rectangular pattern is formed so as to coat a part of a platinum thin film 74 by the electron beam drawing device (FIG. 8(B)). After the exposure, the developing and rinsing are performed, and thereafter calixarene changes to the chemically stable polymer. Therefore, the resist is not dissolved in the solvent or the developing solution of the photoresist. The film thickness of calixarene can be adjusted by changing the revolution number during the spin-coating and the concentration of calixarene. When 5 weight % of calixarene (solvent is monochlorobenzene) is used, and the revolution number is 4000 rpm, the film thickness is 170 nm. It is possible to exactly adjust the film thickness on the order of 10 nm.

Subsequently, the silver thin film is formed, and sulfurated. There are two methods in sulfurating the silver thin film. In the first method of sulfuration, the silicon substrate comprising the silver thin film thereon is brought into the crucible together with the sulfur powder, and heated at 130 degrees in the bake furnace in the nitrogen atmosphere. In the second method of the sulfuration, the substrate is heated at 120 degrees to 300 degrees in hydrogen sulfide diluted with nitrogen.

By the above-mentioned step, the surface of the silver thin film changes to black silver sulfide. Silver sulfide is a stable material existing in nature, and is not deteriorated in the following steps, or not deteriorated with the elapse of time. As a result of sulfuration of the silver thin film, a silver sulfide thin film 75 is formed (FIG. 8(C)).

Next, the calixarene resist 77 is removed by the oxygen ashing or the organic solvent (FIG. 8(D)). In the ashing, the organic material is carbonized and thereby removed, and therefore the resist 77 can selectively be removed without damaging silver sulfide or platinum. When the calixarene resist 77 is removed, an air gap 76 is formed between silver sulfide and platinum. The intervals of the air gaps can be adjusted by changing the film thickness of the calixarene resist 77. Finally, a silver thin film 73 is formed on the silver sulfide thin film 75 by the vacuum evaporation method or the sputtering method.

The operation method of the solid electrolyte switch 10 will be explained with reference to FIG. 8(D).

When the silver thin film 73 is grounded, and the negative voltage (−0.2 V or more) is added to the platinum thin film 74, the switch turns on. On the other hand, when the positive voltage (0.06 V or more) is added to the platinum thin film 74, the switch turns off. When the voltage is not applied, or the applied voltage is small (−0.2 to 0.05 V), the on-state or the off-state is maintained.

Third Embodiment

Figure 2:
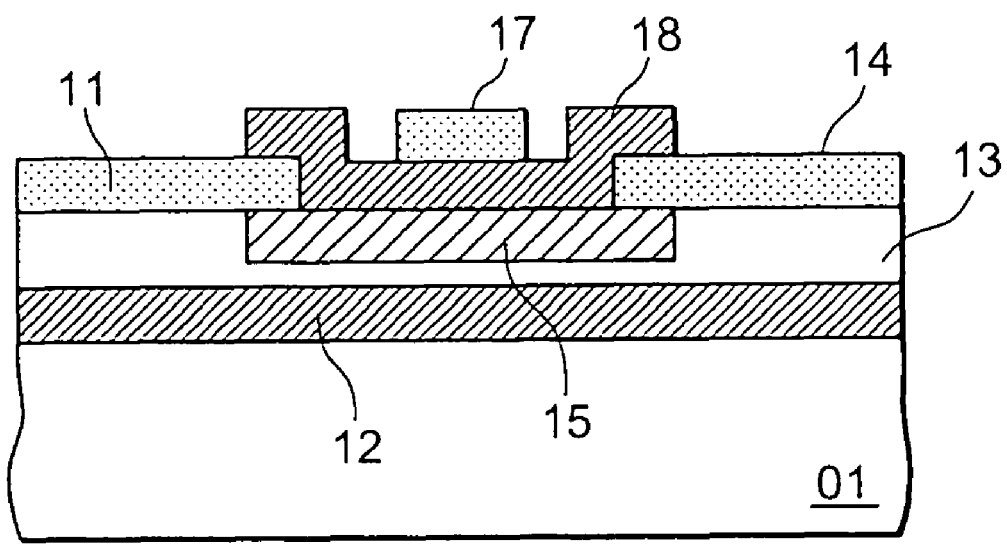
FIG. 2 is a diagram showing a structure of a solid electrolyte transistor according to a third embodiment of the present invention.

FIG. 2 is a structural diagram of a solid electrolyte transistor 20 according to the present embodiment.

The solid electrolyte transistor 20 comprises the semiconductor substrate 01 such as silicon. An insulating film 12 having a thickness of about 20 angstroms to 200 angstroms is disposed on the semiconductor substrate 01. The insulating film 12 may be an insulating film formed of the silicon oxide film, silicon nitride film, silicon oxynitride film and the like. A metal thin film 13 is disposed on the insulating film 12, and a solid electrolyte 15 using the metal ion which is the material of the metal thin film 13 as the carrier is disposed in the metal thin film 13. The metal thin film 13 may be metals such as silver, and may have a film thickness of 200 angstroms to 2000 angstroms. The solid electrolyte 15 may be, for example, silver sulfide, and may have a film thickness of 20 angstroms to 2000 angstroms.

An insulating film 18 is disposed on the solid electrolyte 15, and a gate electrode 17 is disposed on the insulating film 18. The insulating film may be an insulating film having a thickness of about 20 angstroms to 200 angstroms and formed of the silicon oxide film, silicon nitride film, silicon oxynitride film and the like. A source electrode 11 and a drain electrode 14 are disposed on opposite ends of the metal thin film 13. The source electrode, drain electrode, or gate electrode may be an aluminum or metal thin film having a film thickness of 500 to 2000 angstroms.

As one example, a method of manufacturing the solid electrolyte transistor will be described with reference to FIGS. 9(A) to 9(D) in a case where the silicon oxide film is used in the insulating film 12, the silver thin film is used in the metal thin film 13, and silver sulfide is used in the solid electrolyte 15.

Figure 9:
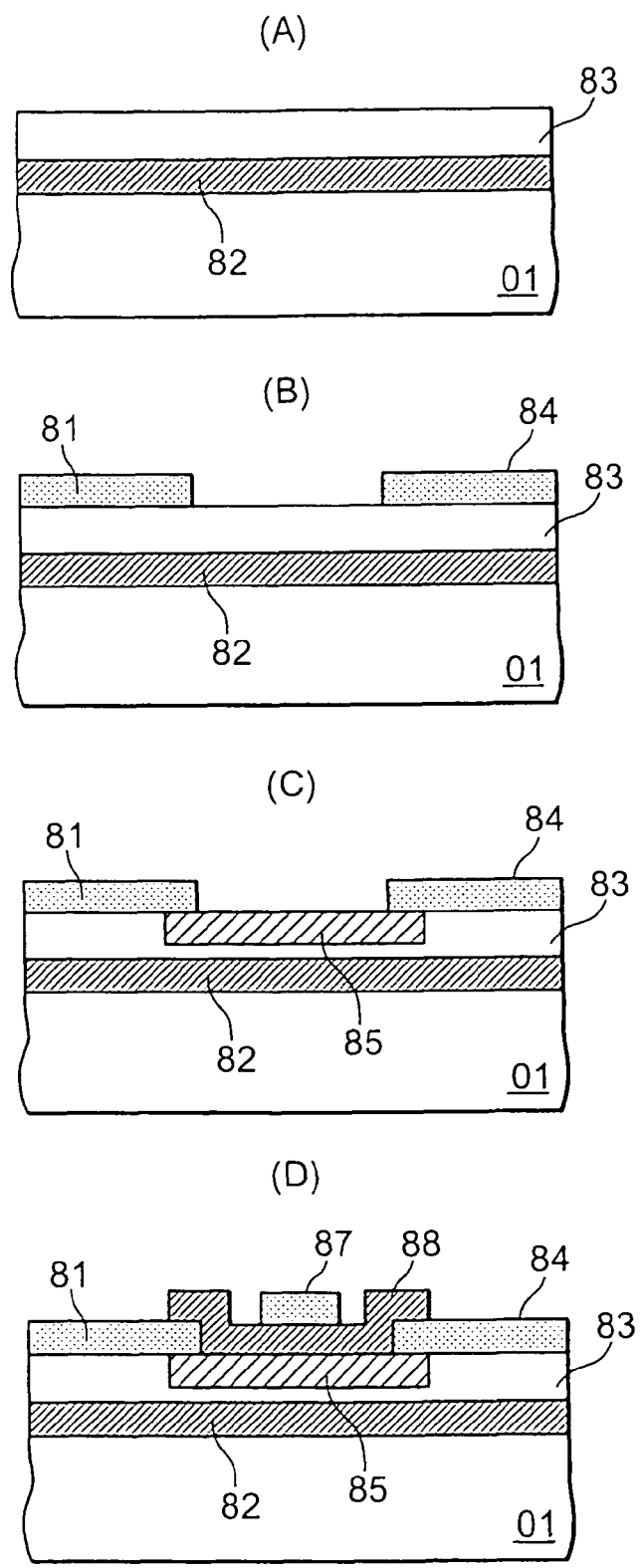
FIGS. 9(A), (B), (C), and (D) are explanatory views of the method of preparing the solid electrolyte transistor shown in FIG. 2 in order of steps.

A silicon oxide film having a film thickness of 300 nm is formed on the silicon substrate 01 such as silicon by the thermal oxidation method (FIG. 9(A)).

A silver thin film 83 having a film thickness of 2500 angstroms is formed by the vacuum evaporation method or the sputtering method, and further a source electrode 81 and a drain electrode 84 are formed by the vacuum evaporation method or the sputtering method (FIG. 9(B)). Thereafter, the sulfuration is performed (FIG. 9(C)). There are two methods in sulfurating the silver thin film 83.

In the first method of sulfuration, the silicon substrate comprising the silver thin film 83 thereon is brought into the crucible together with the sulfur powder, and heated at 130 degrees in the bake furnace in the nitrogen atmosphere. There are two methods in sulfurating the silver thin film 83. In the first method of sulfuration, the silicon substrate comprising the silver thin film 83 thereon is brought into the crucible together with the sulfur powder, and heated at 130 degrees in the bake furnace in the nitrogen atmosphere. When the conductivity of the silver thin film is measured during the sulfuration, the degree of the sulfuration can be determined, and the silver thin film 83 can be sulfurated with excellent control. The sulfuration is performed until the conductivity becomes about 1/10.

In the second method of the sulfuration, the substrate is heated at 120 degrees to 300 degrees in hydrogen sulfide diluted with nitrogen. Also in this case, when the resistance of the silver thin film 83 is measured, the sulfuration can be performed with excellent control. By the above-mentioned sulfuration step, the silver thin film changes to black silver sulfide. Silver sulfide is a stable material existing in nature, and is not deteriorated in the following steps, or not deteriorated with the elapse of time. In the above-mentioned step, the silver sulfide 75 is formed in the silver thin film 84.

Next, an insulating film 88 is formed (FIG. 9(D)). The insulating film 88 may be an insulating film formed of the silicon oxide film, nitride silicon film, silicon oxynitride film and the like, and is formed by a vapor phase growth method or the like. The film thickness may be 20 angstroms to 2000 angstroms. A gate electrode 87 is formed by using aluminum as the material on the insulating film 88 by the sputtering method. The film thickness may be 500 angstroms to 2000 angstroms.

An operation method of the solid electrolyte transistor 20 will be explained with reference to FIG. 9(D).

The source electrode 81 is grounded, and a micro positive voltage (about 10 mV) is added to the drain electrode 84. When the negative voltage (about −1 V) is added to the gate electrode 87, a silver ion in the silver thin film held between silver sulfide 85 and insulating film 82 is attracted by the gate electrode, and moves in the silver sulfide 85. When silver moves, the air gap is generated, a current path to the drain electrode 84 from the source electrode 81 is cut off so that the transistor turns on. Conversely, when the positive voltage (about 1 V) is applied to the gate electrode 87, silver is deposited from the silver sulfide 85 to thereby fill the air gap. In this event, the current path is formed so that the transistor turns on.

Fourth Embodiment

Figure 3:
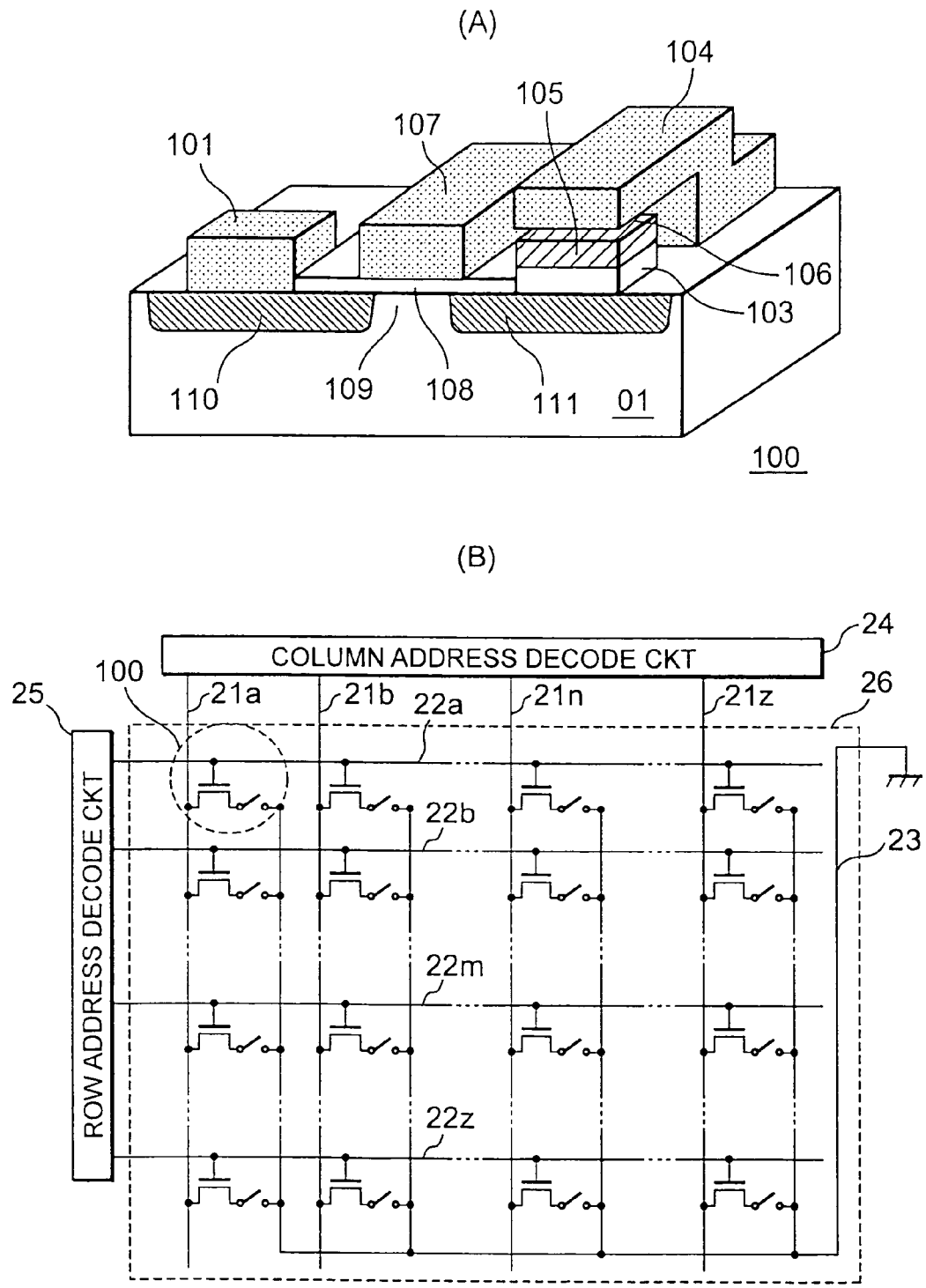
FIG. 3(A) is a structural diagram showing a storage cell according to a fourth embodiment of the present invention.
FIG. 3(B) is a circuit diagram showing a storage device using the storage cell shown in FIG. 3(A)

FIG. 3(A) shows the structural diagram of a storage cell 100 according to the present embodiment, and FIG. 3(B) shows a circuit diagram of a storage device.

The storage cell 100 comprises the semiconductor substrate 01 such as silicon. A source region 110, a drain region 111 and a channel region 109 disposed therebetween are formed in the substrate 01. A part of the source region 110, the channel region 109, and a part of the drain region 111 are coated with an insulating film 108 disposed to have a thickness of about 20 angstroms to 200 angstroms. The insulating film 108 may be an insulating film formed of the silicon oxide film, silicon nitride film, silicon oxynitride film and the like.

A source electrode 101 is disposed on the source region while a gate electrode 107 is disposed on the insulating film 108. The material of the electrode may be metals such as aluminum, silver, and gold, or polysilicon doped at a high concentration. A first metal thin film 103 is disposed on the drain region 111, and a solid electrolyte 105 using the metal ion which is the material of the metal thin film 103 as the carrier is disposed on the first metal thin film 103.

The metal thin film 103 may be metals such as silver, and the film thickness may be 200 angstroms to 2000 angstroms. The solid electrolyte 105 may be, for example, silver sulfide, and the film thickness may be 200 angstroms to 2000 angstroms. A second metal thin film 104 is disposed on the solid electrolyte 105 via an air gap 106.

The storage device is provided with a storage cell array 26 of the storage cells 100. A peripheral circuit of the storage device includes a column address decode circuit 24 and a row address decode circuit 25 which can be prepared by a related art. Connection to each storage cell 100 with respect to the storage cell array 26 carried out as follows.

Specifically, all the second metal thin films 104 of the respective storage cells are connected to one another via a common grounding conductor 23, and grounded. The source electrodes 101 of the storage cells 100 in the same column are connected to one another via a column address line. For example, a column address line 21a is connected to the source electrode 101 from each storage cell 100 in a left-end column. The gate electrodes 107 of the respective storage cells 100 in the same row are connected to one another via a row address line. For example, a row address line 22a is connected to the gate electrode 107 of each storage cell 100 in an upper-end row.

A method of manufacturing the above-mentioned storage device will be described.

As one example, p-type silicon is used as the semiconductor substrate 01 and channel region 109 while n-type silicon is used as the source region 110 and drain region 111. Moreover, silver sulfide is used as the solid electrolyte 105, and the platinum thin film is used as the second metal thin film 104. The column address decode circuit 24 or the row address decode circuit 25 as the peripheral circuit of the storage device can be produced by the use of a semiconductor processing technique in a related art.

In the storage cell 100 constituting the storage cell array 26, the source region 110, channel region 109, drain region 111, insulating film 108, source electrode 101, and gate electrode 107 are produced by using the semiconductor processing technique in the related art.

Furthermore, the first metal thin film 103, solid electrolyte 105, air gap 106, and second metal thin film 104 are produced by using the method of manufacturing the solid electrolyte switch 10 of the above-mentioned example 1 shown in FIGS. 7(A) to 7(D).

Description will be made of the operation method of the present storage device produced by the above-described manufacturing method.

Operations such as write, delete (erase), and read are selectively performed with respect to one specific storage cell in the storage cell array 26. The storage cell may be selected by designating the row address line and column address line connected to the storage cell to be selected. Here, a write state is defined as a case where the bridge is formed between the solid electrolyte 105 and the second metal thin film 104 while a delete state is defined as a case where the bridge is not formed between the solid electrolyte 105 and second metal thin film 104. In order to write the storage cell 100 selected in the storage cell array 26, the positive voltage (+1 V) is applied to the row address line related to the selected storage cell 100, and the positive voltage (+0.2 V) is applied to the column address line related to the selected storage cell 100. At this time, in the selected storage cell 100, an n-channel is generated in the channel region 109 which is p-type silicon, the source region 110 is electrically connected to the drain region 111, and a potential of the drain region 111 becomes substantially equal to that of the source region 110.

In this manner, the positive voltage (about 0.2 V) is applied to the solid electrolyte 105 of the selected storage cell so that a potential difference is caused between the solid electrolyte and the second metal thin film 104 connected to the common grounding conductor. By the potential difference, the metal ion in the solid electrolyte is deposited as the metal, and the bridge is formed between the solid electrolyte and the second metal thin film 104. In order to delete the selected storage cell 100 in the storage cell array 26, the positive voltage (+1 V) is applied to the row address line related to the selected storage cell 100, and the negative voltage (−0.2 V) is applied to the column address line related to the selected storage cell. At this time, the n-channel is generated in the channel region 109 which is p-type silicon, the source region 110 is electrically connected to the drain region 111, and the potential of the drain region 110 becomes substantially equal to that of the source region 111.

In this manner, the negative voltage (about −0.2 V) is applied to the solid electrolyte 105 of the selected storage cell, and the potential difference is caused between the solid electrolyte and the second metal thin film 104 connected to the common grounding conductor. The metal ion forming the bridge moves into the solid electrolyte 105 by the potential difference, and the bridge disappears. In order to read the selected storage cell 100 in the storage cell array 26, the positive voltage (+1 V) is applied to the column address line related to the selected storage cell 100, and the micro positive voltage (0.01 V) is applied to the row address line related to the selected storage cell 100. At this time, the n-channel is generated in the channel region 109 which is p-type silicon, the source region 110 is electrically connected to the drain region 111, and the potential of the drain region 111 is substantially equal to that of the source region 110.

In this manner, the positive voltage (about 0.01 V) is applied to the solid electrolyte 105 of the selected storage cell 100, and the potential difference is caused between the solid electrolyte and the second metal thin film 104 connected to the common grounding conductor 23. The current flows into the column address line in a case where the bridge is formed (write state). On the other hand, the current does not flow in a case where the bridge is not formed (delete state). The state of the storage cell 100 can be read by presence/absence of the current.

Fifth Embodiment

Figure 4:
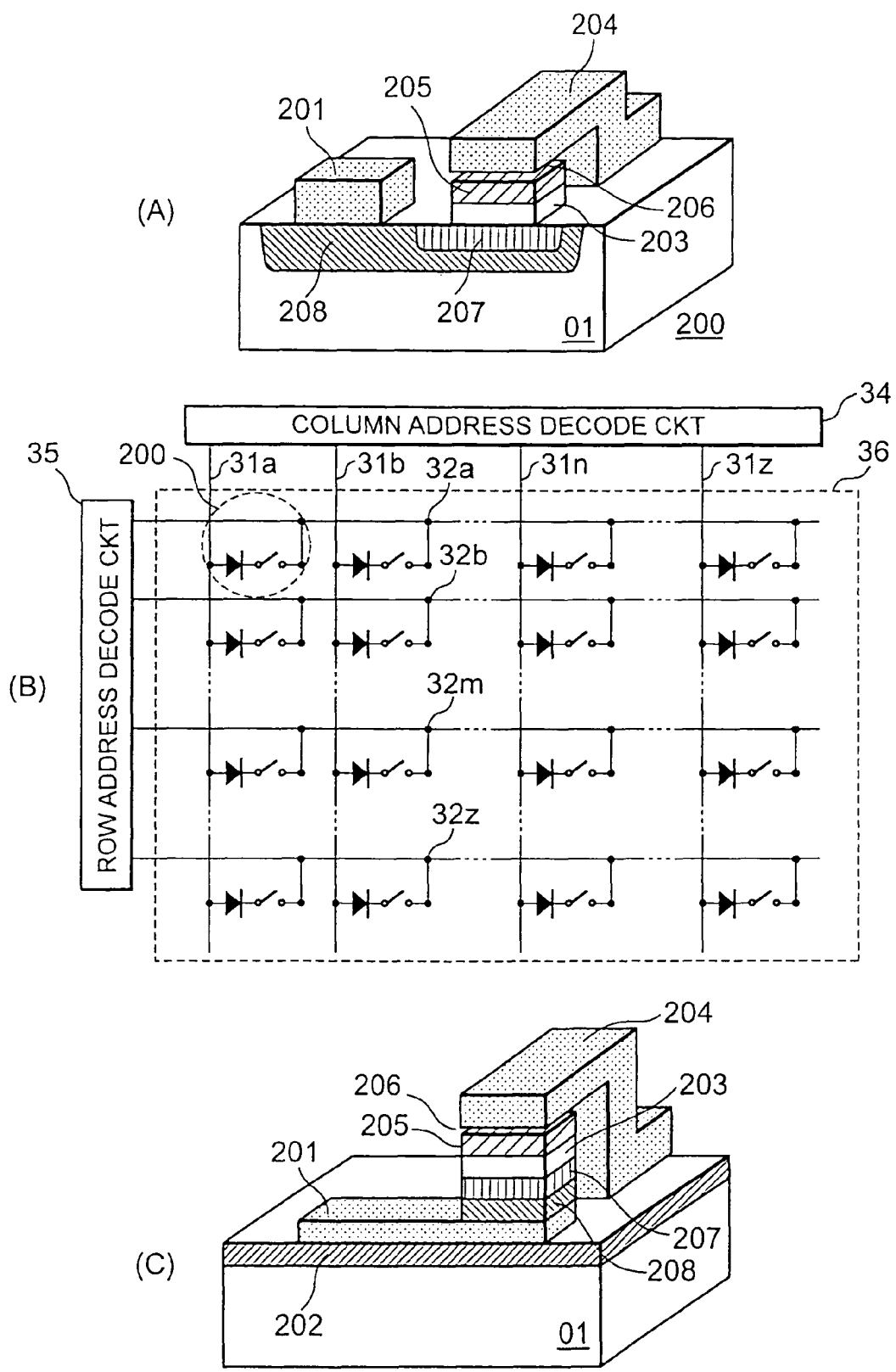
FIG. 4(A) is a structural diagram showing the storage cell according to a fifth embodiment of the present invention.
FIG. 4(B) is a circuit diagram showing the storage device including the storage cell shown in FIG. 4(A)
FIG. 4(C) is a diagram showing a modification of the storage cell shown in FIG. 4(A)

FIG. 4(A) shows the structural diagram of a storage cell 200 according to the present embodiment, and FIG. 4(B) shows a circuit diagram of the storage device.

The storage cell 200 comprises the semiconductor substrate 01 such as silicon. The semiconductor substrate 01 is a p-type semiconductor. An n-type semiconductor region 208 and p-type semiconductor region 207 are disposed in the semiconductor substrate 01. An electrode 201 is disposed on the n-type semiconductor region 208. The material of the electrode may be the metals such as aluminum, silver, and gold, or polysilicon doped at the high concentration.

A first metal thin film 203 is disposed on the p-type semiconductor region 207, and a solid electrolyte 205 using the metal ion which is the material of the first metal thin film 203 as the carrier is disposed on the first metal thin film 203. The first metal thin film 203 may be the metals such as silver, and the film thickness may be 200 angstroms to 2000 angstroms. The solid electrolyte 205 may be, for example, silver sulfide, and the film thickness may be 200 angstroms to 2000 angstroms. A second metal thin film 204 is disposed on the solid electrolyte 205 via an air gap 206.

The storage device is provided with a storage cell array 36 of the storage cells 200. The peripheral circuits of the storage device include a column address decode circuit 34 and a row address decode circuit 35 which can be produced by the related art. The connection to each storage cell 200 in the storage cell array 36 is carried out as follows. Specifically, the electrodes 201 of the respective storage cells 200 in the same column are connected to one another via the column address line. For example, a column address line 31*a* is connected to the electrode 201 of each storage cell 200 in the left-end column. The second metal thin films 204 of the respective storage cells 200 in the same row are connected to one another via the row address line. For example, a row address line 32*a* is connected to the second metal thin film 204 of each storage cell 200 in the upper-end row.

A method of manufacturing the present storage device will be explained.

As one example, p-type silicon is used as the semiconductor substrate 01 while n-type silicon is used as the n-type semiconductor region 208. Moreover, p-type silicon is used as the p-type semiconductor region 207, silver sulfide is used as the solid electrolyte 205, and the platinum thin film is used as the second metal thin film 204. The column address decode circuit 34 and the row address decode circuit 35 as the peripheral circuit of the storage device can be produced by the use of the semiconductor processing technique in the related art.

In the storage cell 200 constituting the storage cell array 36, the n-type semiconductor region 208, p-type semiconductor region 207, and electrode 201 are produced by using the semiconductor processing technique in the related art. Furthermore, the first metal thin film 203, solid electrolyte 205, air gap 206, and second metal thin film 204 are produced by using the method of manufacturing the solid electrolyte switch 10 of the present example 1 shown in FIGS. 7A to 7D.

In FIG. 4(A), the electrode 201 needs to be formed in a case where a wiring resistance is lowered, but does not have to be necessarily formed, when the n-type semiconductor region 208 is used as the wiring of the row address line. A degree of integration in this case may be a size of 2F×2F assuming a minimum processing line width F.

In the storage cell 200 of FIG. 4(A), when the p-type semiconductor 207 and n-type semiconductor 208 are formed between the electrode 201 and the first metal thin film 203 instead of being formed in the semiconductor substrate, an area per one storage cell can be reduced (see FIG. 4(C)).

In detail, an insulating film 202 having a thickness of about 20 angstroms to 200 angstroms is disposed on the semiconductor substrate 01. The insulating film 202 may be an insulating film formed of silicon oxide film, silicon nitride film, silicon oxynitride film and the like. The electrode 201 is disposed on the insulating film 202. The material of the electrode 201 may be the metals such as aluminum, silver, and gold, or polysilicon doped at the high concentration. The n-type semiconductor region 208 is disposed on the electrode 201.

Further the p-type semiconductor region 207 is disposed on the n-type semiconductor 208. The first metal thin film 203 is disposed on the p-type semiconductor region 207, and the solid electrolyte 205 using the metal ion which is the material of the first metal thin film 203 as the carrier is disposed on the first metal thin film 203. The first metal thin film 203 may be the metals such as silver, and the film thickness may be 200 angstroms to 2000 angstroms. The solid electrolyte 205 is, for example, silver sulfide, and the film thickness may be 200 angstroms to 2000 angstroms. The second metal thin film 204 is disposed on the solid electrolyte 205 via the air gap 206.

A method of manufacturing the storage cell of FIG. 4(C) will be explained.

As one example, p-type silicon is used as the semiconductor substrate 01 while n-type silicon is used as the n-type semiconductor region 208. Moreover, p-type silicon is used as the p-type semiconductor region 207, silver sulfide is used as the solid electrolyte 205, and the platinum thin film is used as the second metal thin film 204. The n-type semiconductor region 208, p-type semiconductor region 207, and electrode 201 are produced by using the semiconductor processing technique in the related art. Furthermore, the first metal thin film 203, solid electrolyte 205, air gap 206, and second metal thin film 204 are produced by using the method of manufacturing the solid electrolyte switch 10 of the present example 1 shown in FIG. 7(A) to 7(D).

Description will be made of the operation method of the present storage device produced by the above-described manufacturing method.

Operations such as write, delete, and read have to be selectively performed with respect to one specific storage cell in the storage cell array 36. The storage cell may be selected by designating the row address line and column address line connected to the storage cell to be selected. Here, the write state is defined as the case where the bridge is formed between the solid electrolyte 205 and the second metal thin film 204, and the delete state is defined as the case where the bridge is not formed in the method of preparing the solid electrolyte switch 205 and the second metal thin film 204.

In order to write the storage cell 200 selected in the storage cell array 36, the positive voltage (+0.2 V) is applied to the row address line related to the selected storage cell 200, and the negative voltage (−0.2 V) is applied to the column address line related to the selected storage cell 200. At this time, the potential difference is caused between the solid electrolyte 205 of the selected storage cell and the solid electrolyte switch of the second metal thin film 204. Since a pn-junction is formed in a boundary between the n-type semiconductor region 208 and p-type semiconductor region, a reverse-direction voltage is added to the pn-junction in a case where the positive voltage is added to the electrode 201. Therefore, the potential of the p-type semiconductor region is determined by a relation between a pn-junction capacitance C1 and a capacitance C2 of the solid electrolyte 205 and second metal thin film 204. When C1 is substantially equal to C2, the potential difference between the solid electrolyte 205 and the second metal thin film 204 is about 0.2 V. By the potential difference, the metal ion in the solid electrolyte is deposited as the metal so that the bridge is formed between the solid electrolyte and the second metal thin film 204.

Since only the potential difference of 0.1 V is caused between the solid electrolyte 205 and the second metal thin film 204 related to the non-selected storage cell, the bridge is not formed. Since the current does not flow during the present write, power consumption is low. In order to delete the selected storage cell 200 in the storage cell array 36, the negative voltage (−0.1 V) is applied to the row address line related to the selected storage cell 200, and the positive voltage (0.1 V) is applied to the column address line related to the selected storage cell. At this time, the potential difference is caused between the solid electrolyte 205 and the second metal thin film 204.

By this potential difference, the metal ion forming the bridge moves into the solid electrolyte so that the bridge disappears. In order to read the selected storage cell 200 in the storage cell array 36, the negative voltage (−0.01 V) is applied to the row address line related to the selected storage cell 200, and the positive voltage (0.01 V) is applied to the column address line related to the selected storage cell 200. At this time, the potential difference is caused between the solid electrolyte 205 and second metal thin film 204 of the selected storage cell 200. The current flows in the column address line in a case where the bridge is formed (write state). On the other hand, the current does not flow in a case where the bridge is not formed (delete state). The state of the storage cell 200 can be read by the presence/absence of the current. There is a possibility that the current flows via the adjacent storage cell, but either pn-junction in the current path has a reverse direction. Therefore, the current does not flow via the adjacent storage cell.

Sixth Embodiment

Figure 5:
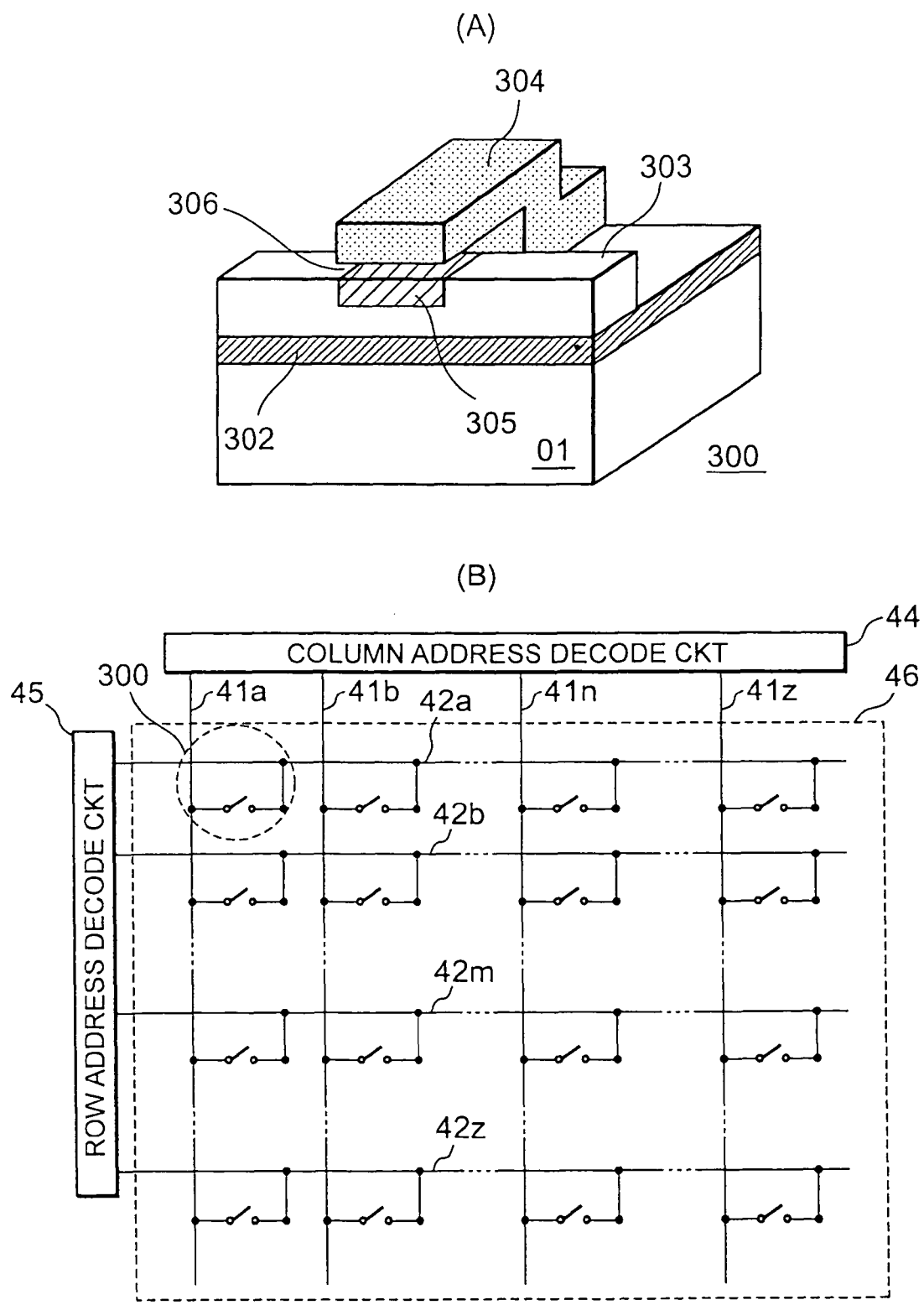
FIG. 5(A) is a structural diagram showing the storage cell according to a sixth embodiment of the present invention.
FIG. 5(B) is a circuit diagram showing the storage device including the storage cell shown in FIG. 5(A)
Figure 6:
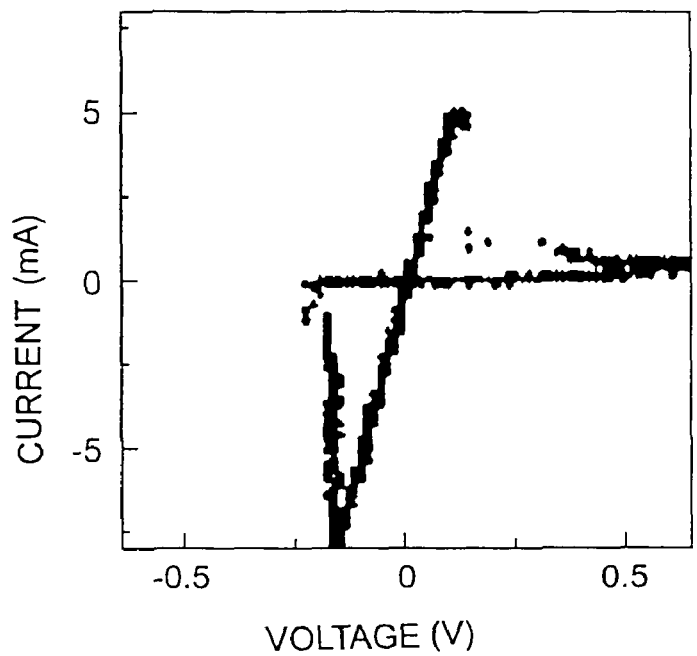
FIG. 6(A) is a diagram showing a current/voltage property of the solid electrolyte switch according to the present invention.
FIG. 6(B) is an explanatory view of a principle operation of the solid electrolyte switch according to the present invention.
Figure 6:
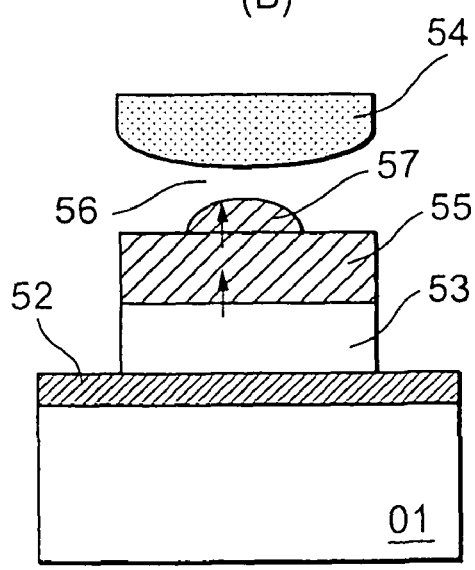

FIG. 5(A) shows the structural diagram of a storage cell 300 according to the present embodiment, and FIG. 5(B) shows a circuit diagram of the storage device.

The storage cell 300 comprises the semiconductor substrate 01 such as silicon. An insulating film 302 having a thickness of about 20 angstroms to 200 angstroms is disposed on the semiconductor substrate 01. The insulating film 302 may be the insulating film formed of the silicon oxide film, silicon nitride film, silicon oxynitride film and the like. A first metal thin film 303 is disposed on the insulating film 302, and a solid electrolyte 305 using the metal ion which is the material of the first metal thin film 303 as the carrier is disposed on the first metal thin film 303.

The first metal thin film 303 may be the metals such as silver, and the film thickness may be 200 angstroms to 2000 angstroms. The solid electrolyte 305 may be, for example, silver sulfide, and the film thickness may be 200 angstroms to 2000 angstroms. A second metal thin film 304 is disposed on the solid electrolyte 305 via an air gap 306.

The storage device is provided with a storage cell array 46 of the storage cells 300. The peripheral circuits of the storage device include a column address decode circuit 44 and a row address solid electrolyte preparation method decode circuit 45 which can be produced by the related art. The connection to each storage cell 300 in the storage cell array 46 is carried out as follows. Specifically, the first metal thin films 303 of the respective cells 300 in the same column are connected to one another via the column address line. For example, a column address line 41a is connected to the first metal thin film 303 from each storage cell 300 in the left-end column. The second metal thin films 304 of the respective storage cells 200 in the same row are connected to one another via the row address line. For example, a row address line 42a is connected to the second metal thin film 304 of each storage cell 300 in the upper-end row.

A method of manufacturing the present storage device will be explained.

As one example, silicon is used as the semiconductor substrate 01, silver sulfide is used as the solid electrolyte 305, and platinum is used as the second metal thin film 304. The column address decode circuit 44 and the row address decode circuit 45 as the peripheral circuits of the storage device can be produced by the use of the semiconductor processing technique in the related art. The first metal thin film 303, solid electrolyte 305, air gap 306, and second metal thin film 304 of the storage cell 300 constituting the storage cell array 46 are produced by using the method of manufacturing the solid electrolyte switch 10 of the present example 1 shown in FIG. 7(A) to 7(D).

Description will be made of the operation method of the present storage device produced by the above-described manufacturing method.

Operations such as write, delete, and read have to be selectively performed with respect to one specific storage cell in the storage cell array 46. The storage cell may be selected by designating the row address line and column address line connected to the storage cell to be selected. Here, the write state is defined as the case where the bridge is formed between the solid electrolyte 305 and the second metal thin film 304, and the delete state is defined as the case where the bridge is not formed in the solid electrolyte 305 and the second metal thin film 304.

In order to write the storage cell 300 selected in the storage cell array 46, the negative voltage (−0.1 V) is applied to the row address line related to the selected storage cell 300, and the positive voltage (+0.1 V) is applied to the column address line related to the selected storage cell 300. At this time, the potential difference is caused between the solid electrolyte 305 and the second metal thin film 304 of the selected storage cell. The potential difference between the solid electrolyte 305 and the second metal thin film 304 is 0.2 V. By the potential difference, the metal ion in the solid electrolyte is deposited as the metal so that the bridge is formed between the solid electrolyte and the second metal thin film 304.

Since only the potential difference of 0.1 V or less is generated between the solid electrolyte 305 and the second metal thin film 304 related to the non-selected storage cell, the bridge is not formed. In order to delete the selected storage cell 300 in the storage cell array 46, the positive voltage (+0.05 V) is applied to the row address line related to the selected storage cell 300, and the negative voltage (−0.05 V) is applied to the column address line related to the selected storage cell. At this time, the potential difference is caused between the solid electrolyte 305 and the second metal thin film 304. By this potential difference, the metal ion forming the bridge moves into the solid electrolyte so that the bridge disappears. In order to read the selected storage cell 300 in the storage cell array 46, the negative voltage (−0.01 V) is applied to the row address line related to the selected storage cell 300, and an ion supply layer 507 can be omitted in a case where metal X is used in the selected first wiring layer 13. The positive voltage (0.01 V) is applied to the column address line related to the storage cell 300. At this time, the potential difference is caused between the solid electrolyte 305 and second metal thin film 304 of the selected storage cell 300.

The current flows in the column address line in a case where the bridge is formed (write state). On the other hand, the current does not flow in a case where the bridge is not formed (delete state). There is a possibility that the current flows via the adjacent storage cell, but a current value is reduced by a certain resistance in the current path, and therefore it can be judged whether or not the current has flown via the adjacent storage cell.

Seventh Embodiment

FIG. 10(A) shows a structural diagram of a solid electrolyte switch 500A according to the present embodiment.

The solid electrolyte switch 500A is disposed on a substrate 501. The substrate 501 has, for example, a structure in which the surface of the silicon substrate is coated with an insulating layer. A first wiring layer 503 is disposed on the substrate 501, and an ion supply layer 507 is disposed on the first wiring layer 503. A solid electrolyte layer 506 is disposed on the ion supply layer 507, and an interlayer insulating layer 502 is disposed so as to coat the substrate 501. A part of the interlayer insulating layer 502 on the solid electrolyte layer 506 is opened to form a via hole, and an opposite electrode layer 505 is disposed in the vicinity of the via hole through the solid electrolyte layer 506 and an air gap 508. Furthermore, a second wiring layer 504 is disposed so as to coat the opposite electrode layer 505.

The solid electrolyte layer 506 is, for example, copper sulfide which is a compound conductor, and the film thickness may be 20 angstroms to 200 angstroms. In the first wiring layer 503, copper having a film thickness of 200 to 3000 angstroms is used. The material of the ion supply layer 507 is the metal ion included in the solid electrolyte layer 506. When copper is used in the first wiring layer 503, the first wiring layer 503 itself can be the ion supply layer, and therefore the ion supply layer 507 may be omitted. When the first wiring layer 503 is other than copper, copper is used as the material in the ion supply layer 507, and the film thickness may be about 20 to 500 angstroms. In the second wiring layer 504, copper having a film thickness of 200 to 3000 angstroms is used. A size of the air gap 508 is about 10 angstroms to 1000 angstroms.

When the solid electrolyte layer 506 is made of sulfides of metal X other than copper, the ion supply layer 507 needs to be a material containing the metal X. A combination of the solid electrolyte layer 506 and ion supply layer 507 may be, in addition to copper sulfide-copper described above, chromium sulfide-chromium, silver sulfide-silver, titanium sulfide-titanium, tungsten sulfide-tungsten, and nickel sulfide-nickel. Other than titanium described above, the opposite electrode layer 505 may contain platinum, aluminum, copper, tungsten, vanadium, niobium, chromium, molybdenum, or nitride, or silicide. In addition to copper described above, a wiring material which has heretofore been used may also be used, and, for example, aluminum, gold and the like may also be used. When the metal X is used in the first wiring layer 503, the ion supply layer 507 can be omitted.

Figure 12:
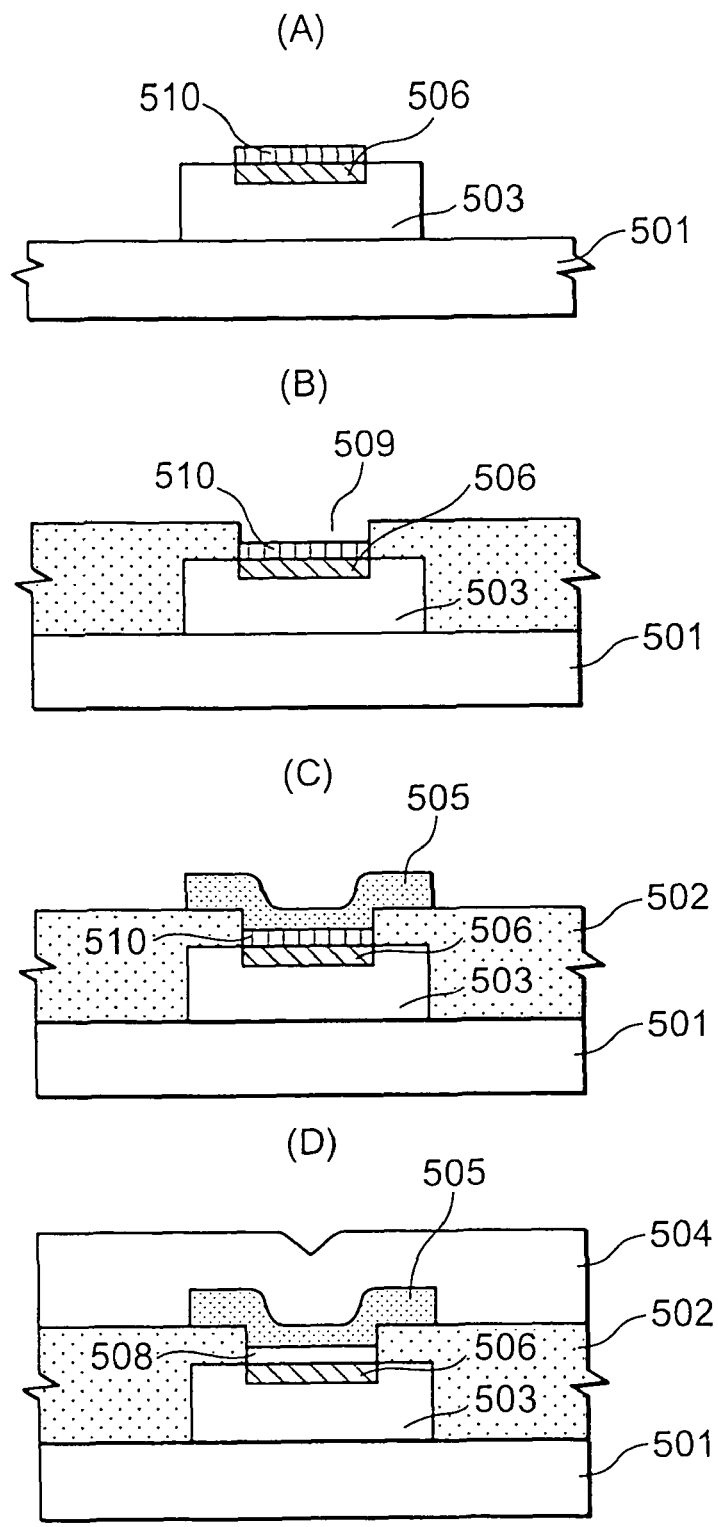
FIGS. 12(A), (B), (C), and (D) are is a sectional views showing respective steps of a method of manufacturing the solid electrolyte switch according to a seventh embodiment.

One example of manufacturing steps will be described with reference to FIG. 12.

The silicon substrate is oxidized to produce the substrate 501. A copper thin film having a film thickness of 2000 angstroms is formed on the substrate 501 by the vacuum evaporation method or the sputtering method. Thereafter, a resist mask whose region other than the first wiring layer 503 is opened is used, and the layer is processed in the form of the first wiring layer 503 by a wet etching method or reactive ion etching method.

A resist pattern having an opening in a via hole 509 region is used as a mask to sulfurate the opening. The sulfuration is performed by anode polarization in an aqueous solution containing sulfide. A copper thin film is used as a cathode to perform the anode polarization in the aqueous solution containing 0.05 mol/liter of sodium sulfide. The added voltage is about 0.5 V, and a sulfide amount is adjusted by controlling the current. Reaction is stopped where the copper thin film is sulfurated by about 20 to 200 angstroms from the surface. A portion sulfurated to form copper sulfide forms the solid electrolyte layer 506 while a non-sulfurated remaining copper portion forms the first wiring layer 503. Since the material of the first wiring layer 503 is a metal constituting the solid electrolyte, the ion supply layer 507 can be omitted.

There are two sulfuration methods other than the sulfuration method by the above-described anode polarization. In the second method of sulfuration, the substrate 501 comprising the copper thin film thereon is brought into the crucible together with the sulfur powder, and heated at 130 degrees in the bake furnace in the nitrogen atmosphere. When the conductivity of the copper thin film is measured during the sulfuration, the degree of the sulfuration can be determined, and the copper thin film can be sulfurated with excellent control. The sulfuration is stopped where only the surface layer of the copper thin film is sulfurated. In a third method of sulfuration, the substrate is heated at 120 degrees to 300 degrees in hydrogen sulfide diluted with nitrogen. Also in this case, when the resistance of the copper thin film is measured, the sulfuration can be performed with excellent control. By this sulfuration step, the surface of the copper thin film changes to copper sulfide. Moreover, instead of sulfurating the copper thin film to form copper sulfide, copper sulfide may also be deposited by the sputtering method or a laser abrasion method in the related art.

Next, a sacrificial layer 510 is formed in order to form the air gap 508. Polymer which is decomposed at 400 degrees to 500 degrees is used as the sacrificial layer 510. For example, a norbornene-based resin which is a thermosetting resin is used. The norbornene resin is applied by the spin-coating, and a hardening treatment is performed. Instead of the norbornene-based resin, any polymer may be used that is insoluble to the photoresist and that has thermal resistance and that is decomposed at about 500 degrees.

Thereafter, the resist mask whose region other than the via hole 509 is opened is used to process the norbornene resin in the form of the via hole 509 by the wet etching method or the reactive ion etching method. In this manner, the sacrificial layer 510 is formed. The size of the sacrificial layer 510 has to be larger than or equal to that of the via hole 509 region. Here, the structure shown in FIG. 12(A) can be formed.

Subsequently, the interlayer insulating layer 502 is formed. A silicon oxynitride film is formed by the sputtering method. After forming the film, the resist pattern whose via hole 509 region is opened is used as the mask to form the via hole 509 by the dry etching or wet etching (FIG. 12(B)). The material of the interlayer insulating layer 502 is preferably a low dielectric film, and a step of a low formation temperature is low is desirable.

Next, the opposite electrode layer 505 is formed. Titanium is formed by the vacuum evaporation method (FIG. 12(C)).

Then, copper is stacked by the sputtering method, and the resist mask which is opened except the region of the second wiring layer 504 is used to form the second wiring layer 504 by a dry etching method. Finally, the temperature is raised at about 500 degrees to decompose the norbornene-based resin so that the air gap is formed (FIG. 12(D)).

After producing the device, a voltage of ±4 V is applied to the solid electrolyte layer 506 and the opposite electrode layer 505. Thus, an on-voltage of transition to the on-state from the off-state and an off-voltage of transition to the off-state from the on-state are set to about ±2 V. The setting of the voltage can appropriately be changed in accordance with a use purpose.

Eighth Embodiment

FIG. 10(B) shows a structural diagram of a solid electrolyte switch 500B by the present embodiment.

The solid electrolyte switch 500B is disposed on the substrate 501. For the substrate 501, for example, the surface of the silicon substrate is coated with the insulating layer norbornene resin by the spin coating, and is hardened/treated. The first wiring layer 503 is disposed on the substrate 501, and the opposite electrode layer 505 is disposed on the first wiring layer 503. The interlayer insulating layer 502 is disposed so as to coat the opposite electrode layer 505 and substrate 501. A part of the interlayer insulating layer 502 on the opposite electrode layer 505 is opened to form the via hole, and the solid electrolyte layer 506 is disposed in the vicinity of the via hole through the opposite electrode layer 505 and air gap 508. Furthermore, the ion supply layer 507 is disposed on the solid electrolyte layer 506, and the second wiring layer 504 is disposed so as to coat the ion supply layer 507.

The solid electrolyte layer 506 is, for example, copper sulfide which is the compound conductor, and the film thickness may be 20 angstroms to 2000 angstroms. In the second wiring layer 504, copper having a film thickness of 200 to 3000 angstroms is used. The material of the ion supply layer 507 is the metal ion included in the solid electrolyte layer 506. When copper is used as the second wiring layer 504, the second wiring layer 504 is coated with the norbornene resin by the spin coating, and is hardened/treated. Since 504 itself can serve as the ion supply layer, the ion supply layer 507 may be omitted.

When the second wiring layer 504 is other than copper, copper is used as the material in the ion supply layer 507, and the film thickness may be about 20 to 500 angstroms. In the second wiring layer 504, copper having a film thickness of 200 to 3000 angstroms is used. The size of the air gap 508 is about 10 angstroms to 1000 angstroms.

When the solid electrolyte layer 506 is made of the sulfide of the metal X other than copper, the ion supply layer 507 needs to be the material containing the metal X. The combination of the solid electrolyte layer 506 and ion supply layer 507 may be, in addition to copper sulfide-copper described above, chromium sulfide-chromium, silver sulfide-silver, titanium sulfide-titanium, tungsten sulfide-tungsten, and nickel sulfide-nickel. Other than titanium described above, the opposite electrode layer 505 may contain platinum, aluminum, copper, tungsten, vanadium, niobium, tantalum, chromium, molybdenum, or nitride, or silicide or 509.

In addition to copper described above, the wiring material which has heretofore been used may also be used as the first wiring layer 503 and second wiring layer 504, and, for example, aluminum, gold and the like may also be used. When the metal X is used as the second wiring layer 504, the ion supply layer 507 can be omitted.

Figure 13:
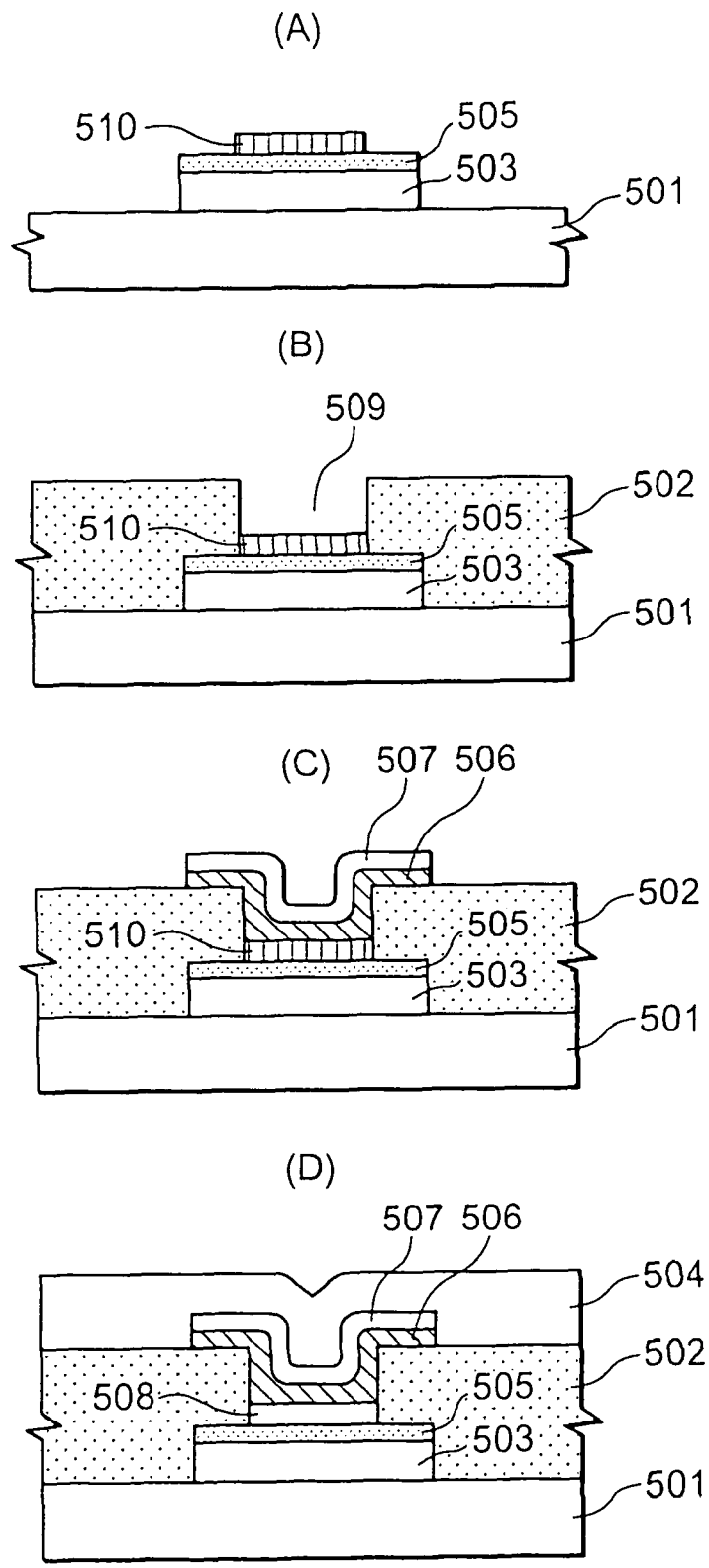
FIGS. 13 (A), (B), (C), and (D) are is a sectional views showing respective steps of the method of manufacturing the solid electrolyte switch according to an eighth embodiment.
Figure 14:
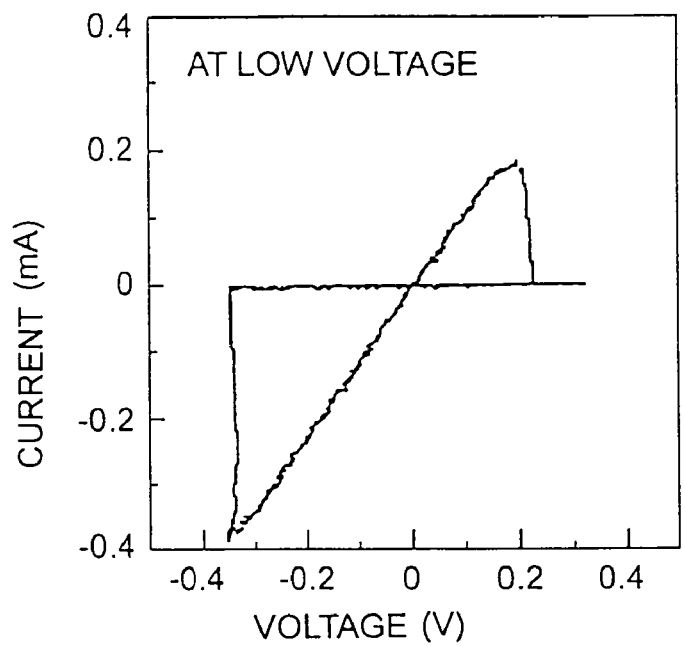
FIGS. 14(A), (B) are diagrams showing a method of controlling a voltage in the present invention, and showing a current/voltage property of the solid electrolyte switch during changing of the voltage.
Figure 14:
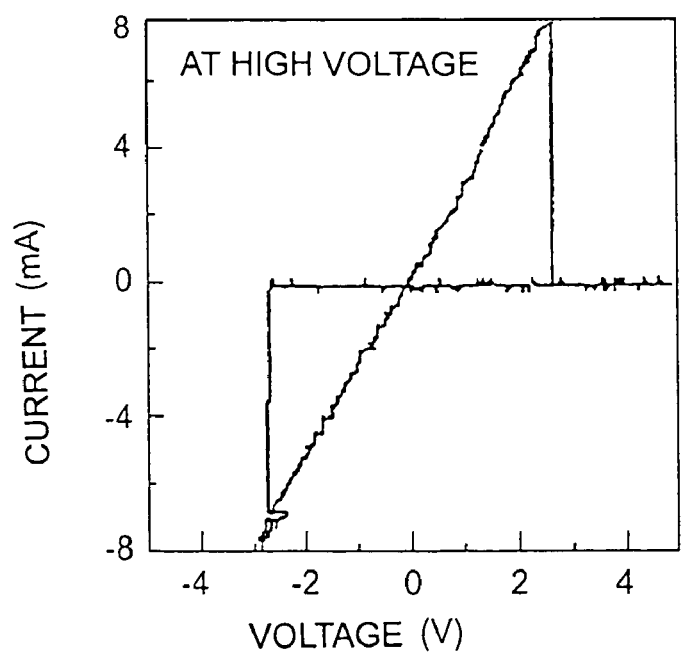

One example of the manufacturing steps will be described with reference to FIG. 13.

The silicon substrate is oxidized to produce the substrate 501. The copper thin film having a film thickness of 2000 angstroms is formed on the substrate 501 by the vacuum evaporation method or the sputtering method. Next, the opposite electrode layer 505 is formed. Titanium is formed by the vacuum evaporation method. The resist pattern having the opening in the region other than the first wiring layer 503 is used as the mask to process the shape of the first wiring layer 503 by the wet etching method or the reactive ion etching method.

Then, the sacrificial layer 510 is formed in order to produce the air gap 508. Polymer which is decomposed at about 400 degrees to 500 degrees is used in the sacrificial layer 510. For example, the norbornene-based resin which is the thermosetting resin is used. The norbornene resin is applied by the spin-coating, and the hardening treatment is performed. Instead of the norbornene-based resin, any polymer may be used that is not soluble to the photoresist and that has thermal resistance and that is decomposed at about 500 degrees.

Thereafter, the resist mask whose region other than the via hole 509 is opened is used to process the norbornene resin in the form of the via hole 509 by the wet etching method or the reactive ion etching method so that the sacrificial layer 510 is formed. The size of the sacrificial layer 510 has to be larger than or equal to that of the via hole 509 region. Here, the structure shown in FIG. 13(A) can be formed.

Subsequently, the interlayer insulating layer 502 is formed. The silicon oxynitride film is formed by the sputtering method. After forming the film, the resist pattern whose via hole 509 region is opened is used as the mask to form the via hole 509 by the dry etching or wet etching (FIG. 13(B)). The material of the interlayer insulating layer 502 is preferably the low dielectric film, and the step having the low formation temperature is desirable.

Next, the solid electrolyte layer 506 is formed. The copper thin film having a film thickness of 2000 angstroms is formed by the vacuum evaporation method or the sputtering method. Then, the sulfuration is performed by the anode polarization in the sulfide-containing aqueous solution. The copper thin film is used as the cathode to perform the anode polarization in the aqueous solution containing 0.05 mol/liter of sodium sulfide. The added voltage is about 0.5 V so that the film is completely sulfurated.

There are two sulfuration methods other than the sulfuration method by the above-described anode polarization. In the second method of sulfuration, the substrate 501 comprising the copper thin film thereon is brought into the crucible together with the sulfur powder, and heated at 130 degrees in the bake furnace in the nitrogen atmosphere. When the conductivity of the copper thin film is measured during the sulfuration, the degree of the sulfuration can be determined so that the copper thin film can be sulfurated with excellent control. The sulfuration is stopped where only the surface layer of the copper thin film is sulfurated. In the third method of sulfuration, the substrate is heated at 120 degrees to 300 degrees in hydrogen sulfide diluted with nitrogen. Also in this case, when the resistance of the copper thin film is measured, the sulfuration can be performed with excellent control.

Moreover, instead of sulfurating the copper thin film to form copper sulfide, copper sulfide may also be deposited by the sputtering method or the laser abrasion method in the related art. The resist mask which is opened except the region of the solid electrolyte layer 506 is used to form the solid electrolyte layer 506 by the reactive ion etching method (FIG. 13(C)).

Next, copper is stacked by the sputtering method, and the resist mask which is opened except the region of the second wiring layer 504 is used to form the second wiring layer 504 by the reactive ion etching method. Since the second wiring layer 504 is copper, the production of the ion supply layer 507 is omitted.

Finally, the temperature is raised at about 500 degrees so that the norbornene resin is decomposed to form the air gap (FIG. 13(D)).

After producing the device, the voltage of ±4 V is applied to the solid electrolyte layer 506 and the opposite electrode layer 505. In this manner, the on-voltage of transition to the on-state from the off-state, and the off-voltage of the transition to the off-state from the on-state are set to about ±2 V. The setting of the voltage can appropriately be changed in accordance with the use purpose.

Ninth Embodiment

A switch mainly used in a field programmable gate array (FPGA) is an anti-fuse device. Since the resistance at an on-time is small, there is a characteristic that a signal delay is small, but re-programming is impossible. During the programming of FPGA, debugging is impossible, and the program cannot be switched during operation.

Even when the power is cut off, the solid electrolyte switch can hold the on-state or the off-state. Furthermore, the resistance of the on-state is as small as several hundreds of Ω or less. From this reason, it is found out that the solid electrolyte switch is suitable for the switch for connection and function selection of a logic circuit block of FPGA. The anti-fuse device which has heretofore been used is not re-programmable, while the solid electrolyte switch is re-programmable $10^6$ times. This is confirmed by the present inventor. The solid electrolyte switch is structurally simple, and is operable with a size which is approximately equal to an atomic size in principle. Therefore, further miniaturization is possible as compared with the conventional electric device.

Figure 11:
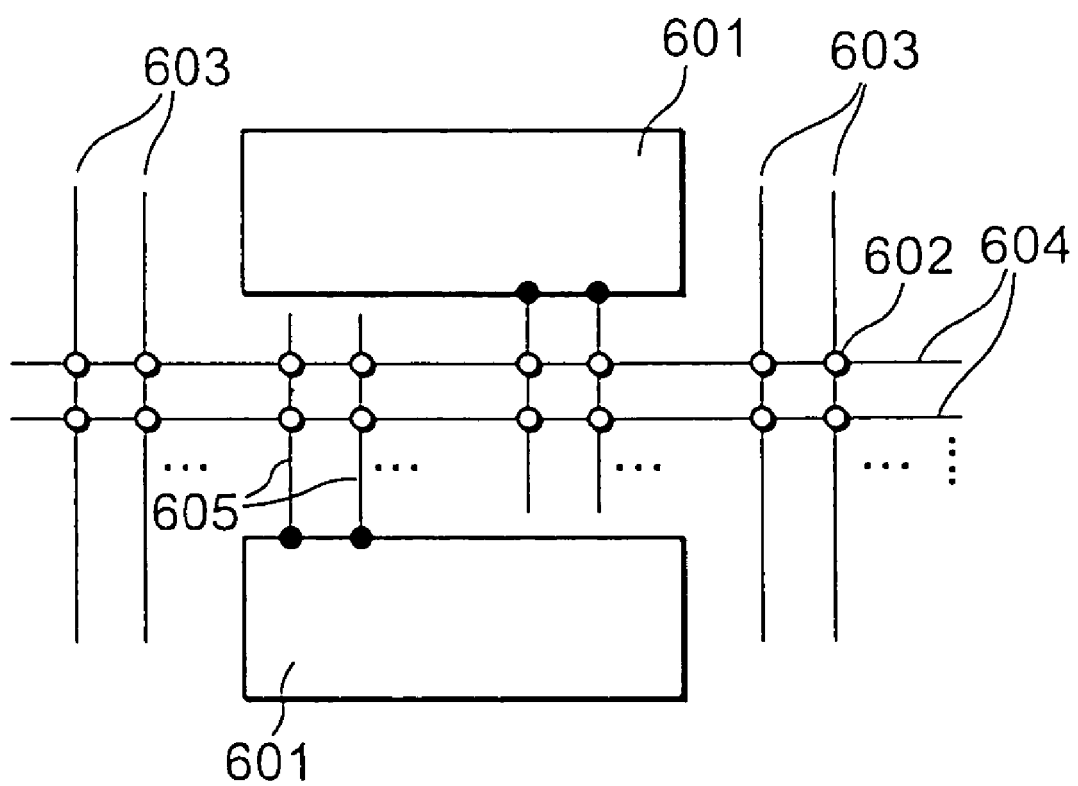
FIG. 11 is a diagram showing FPGA of the present invention comprising a logic block, wiring, and solid electrolyte switch.

FIG. 11 is a schematic diagram of the FPGA in which the solid electrolyte switch according to the present embodiment is used.

A basic unit of FPGA comprises logic circuit blocks 601, wirings 602 to 604, and solid electrolyte switches 605 which switch the connection of the wirings.

Figure 10:
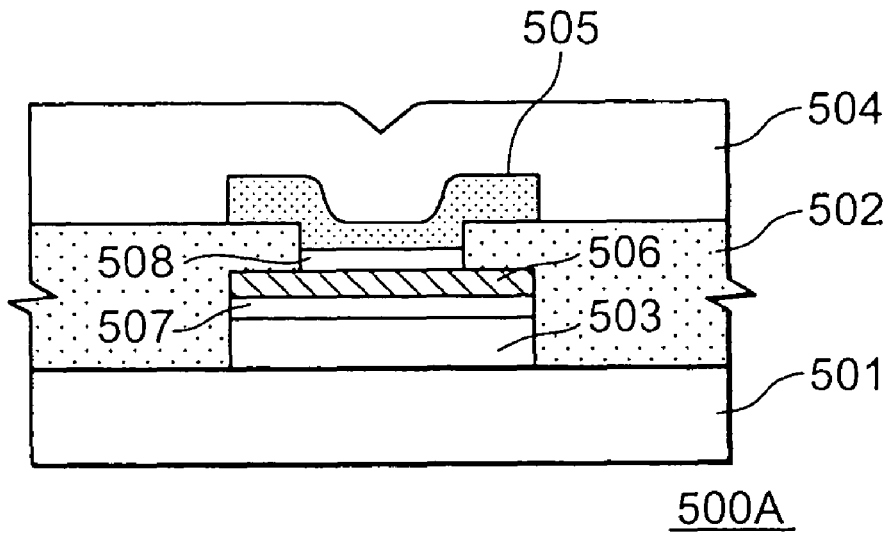
FIGS. 10(A) and (B) are diagrams showing the solid electrolyte switch according to each embodiment of the present invention and the solid electrolyte switch in a via hole.
Figure 10:
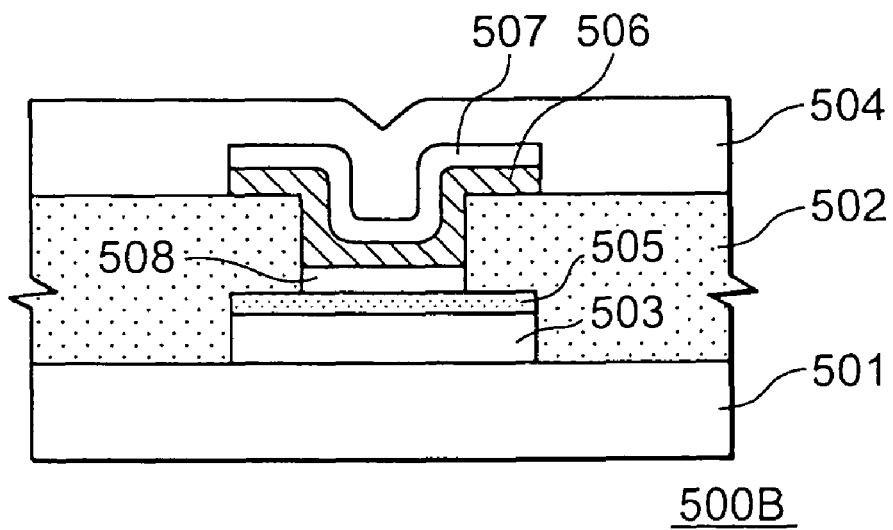

The logic block 601 and peripheral circuits are formed in the substrate 01 of FIG. 1 or 2 or the substrate 601 of FIG. 10, and the solid electrolyte switch described in any of the first and second and ninth embodiments is produced on the substrate 01 or 601.

INDUSTRIAL APPLICABILITY

According to the present invention, there is provided a storage device using a solid electrolyte, and it is possible to especially provide a structure of a storage device having a circuit constitution advantageous for integration, and a method of manufacturing the device.

The invention claimed is:

1. An electric device which is a solid electrolyte switch and having a latch function, comprising:
    a first metal thin film that is disposed on an insulating film, the first metal thin film contacting with the insulating film,
    a solid electrolyte that is disposed on a top surface of the first metal thin film, a metal ion of the first metal thin film being used as a carrier in the solid electrolyte, and
    a second metal thin film that is disposed over the solid electrolyte and over the top surface of the first metal thin film via an air gap,
    wherein the second metal thin film does not make contact with the solid electrolyte, and
    wherein the first metal thin film and the second metal thin film are partially overlapped in a vertical direction with respect to the insulating film.

2. An electric device which is a solid electrolyte switch and having a latch function, comprising:
    a solid electrolyte that is disposed in a first part on a top surface of an insulating film;
    a first metal thin film that is disposed on the solid electrolyte; and
    a second metal thin film that is disposed on the top surface of the insulating film,
    wherein the solid electrolyte is disposed in a second part over the second metal thin film via an air gap,
    wherein a metal ion as a carrier of the solid electrolyte being used as a material in the first metal thin film,
    wherein the second metal thin film does not contact with the solid electrolyte, and
    wherein the first metal thin film and the second metal thin film are partially overlapped in a vertical direction with respect to the insulating film.

3. A storage device, comprising:
    one storage cell forming a constituting element of the storage device comprises (1) one field-effect transistor and (2) one solid electrolyte switch according to claim 1 or 2,
    the solid electrolyte switch according to claim 1 or 2 is disposed on a drain region of the field-effect transistor formed on a semiconductor substrate surface,
    the second metal thin film of the solid electrolyte switch is connected to a common grounding conductor, a source of the field-effect transistor is connected to a column address line, and a gate of the field-effect transistor is connected to a row address line.

4. A storage device, comprising:

one storage cell forming a constituting element of the storage device comprises (1) one diode and (2) one solid electrolyte switch according to claim 1 or 2, the solid electrolyte switch according to claim 1 or 2 is disposed on one electrode of a diode formed on a semiconductor substrate surface, the second metal thin film of the solid electrolyte switch is connected to row address line, and the other electrode of the diode is connected to a column address line.

5. A storage device, comprising:

one storage cell forming a constituting element of the storage device and comprising the solid electrolyte switch according to claim 1 or 2, a part of the first metal thin film connected to a row address line formed on a semiconductor substrate surface is the solid electrolyte in which a metal ion of the first metal thin film is used as a carrier, and the solid electrolyte intersects with the second metal thin film connected to a column address line via the air gap.

6. An electric device, wherein:

a semiconductor thin film is disposed in a portion contacting with the gap in the second metal thin film according to claim 1 or 2, and a Schottky barrier is formed in an interface between a semiconductor and a metal so that a rectification function operates, when the solid electrolyte switch turns on.

7. A storage device, wherein:

a semiconductor thin film is disposed in a portion contacting with the gap in the second metal thin film according to claim 5, and a Schottky barrier is formed in an interface between a semiconductor and a metal so that a rectification function operates, when the solid electrolyte switch turns on.

8. An electric device according to claim 1 or claim 2, wherein the solid electrolyte is any one of silver ion conductive solid electrolytes, and copper ion conductive solid electrolytes, and a second metal is any one of platinum, tungsten, aluminum, gold, copper, and silver.

9. A storage device according to claim 3, wherein the solid electrolyte is any one of silver ion conductive solid electrolytes, and copper ion conductive solid electrolytes, and said second metal is any one of platinum, tungsten, aluminum, gold, copper, and silver.

10. An electric device as the solid electrolyte switch according to claim 1 or 2, wherein:

a voltage is applied between a solid electrolyte layer and an opposite electrode layer at a manufacturing time in order to control an on-voltage which transits to an on-state from an off-state and an off-voltage which transits to the off-state from the on-state.

11. An electric device as a field programmable gate array comprising the solid electrolyte switch according to claim 1 or 2, wherein:

the solid electrolyte switch is used as a first switch of wirings between logic blocks and a second switch which selects a function of the logic block.

* * * * *